(12) United States Patent
Pressas et al.

(10) Patent No.: US 11,719,755 B2
(45) Date of Patent: *Aug. 8, 2023

(54) BATTERY CHARGING CIRCUIT AND METHOD

(71) Applicant: PETALITE LIMITED, Birmingham (GB)

(72) Inventors: Stavros Pressas, Birmingham (GB); Leigh Purnell, Birmingham (GB)

(73) Assignee: Petalite Limited, Birmingham (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/653,803

(22) Filed: Mar. 7, 2022

(65) Prior Publication Data

US 2022/0221521 A1 Jul. 14, 2022

Related U.S. Application Data

(63) Continuation of application No. 16/318,915, filed as application No. PCT/GB2017/052143 on Jul. 20, 2017, now Pat. No. 11,327,119.

(30) Foreign Application Priority Data

Jul. 21, 2016 (EP) ..................................... 16386011
Jul. 25, 2016 (GB) ..................................... 1612874

(51) Int. Cl.
*G01R 31/389* (2019.01)
*G01R 31/3842* (2019.01)
*H02J 7/04* (2006.01)

(52) U.S. Cl.
CPC ....... *G01R 31/389* (2019.01); *G01R 31/3842* (2019.01); *H02J 7/04* (2013.01)

(58) Field of Classification Search
CPC ...... H02J 7/00; H02J 7/04; H02J 7/007; H02J 7/0069; H02J 7/0042; G01R 31/389; G01R 31/3842
USPC .................................................. 324/430, 678
See application file for complete search history.

(56) References Cited

U.S. PATENT DOCUMENTS

| | | |
|---|---|---|
| 4,843,299 A | 6/1989 | Hutchings |
| 5,111,131 A | 5/1992 | Somerville |
| 5,166,596 A | 11/1992 | Goedken |
| 5,281,919 A | 1/1994 | Palanisamy |
| 5,304,917 A | 4/1994 | Somerville |

(Continued)

FOREIGN PATENT DOCUMENTS

| | | |
|---|---|---|
| CN | 1440114 | 9/2003 |
| CN | 204290434 | 4/2015 |

(Continued)

OTHER PUBLICATIONS

Jan @ Pololu Robotics & Electronics. "Understanding battery capacity: Ah is not A". Nov. 2010. (Year: 2010).*

(Continued)

*Primary Examiner* — Jermele M Hollington
*Assistant Examiner* — Sean Curtis
(74) *Attorney, Agent, or Firm* — Lewis & Reese, PLLC

(57) ABSTRACT

A method of charging a battery, the method comprising the steps of:
providing a charging current to the battery; determining a property of the battery substantially continuously during charging; and varying a property of the charging current in dependence on the determined property of the battery.

8 Claims, 17 Drawing Sheets

(56) References Cited

U.S. PATENT DOCUMENTS

| | | | |
|---|---|---|---|
| 5,343,380 A | 8/1994 | Champlin | |
| 5,541,490 A | 7/1996 | Sengupta et al. | |
| 5,598,085 A | 1/1997 | Hasler | |
| 5,872,443 A * | 2/1999 | Williamson | H01M 10/425 |
| | | | 320/160 |
| 5,932,988 A * | 8/1999 | Landon | H01M 4/0445 |
| | | | 320/100 |
| 6,137,265 A | 10/2000 | Cummings et al. | |
| 6,271,643 B1 | 8/2001 | Becker et al. | |
| 6,362,603 B2 * | 3/2002 | Suzuki | H02J 7/1484 |
| | | | 320/152 |
| 6,366,056 B1 | 4/2002 | Podrazhansky et al. | |
| 6,459,175 B1 | 10/2002 | Potega | |
| 7,002,265 B2 | 2/2006 | Potega | |
| 7,227,336 B1 | 6/2007 | Van Schalkwijk et al. | |
| 8,032,316 B2 | 10/2011 | Rocci et al. | |
| 8,111,035 B2 * | 2/2012 | Nishino | H02J 7/0069 |
| | | | 307/64 |
| 8,237,412 B2 * | 8/2012 | Johnson | H02J 7/00 |
| | | | 320/140 |
| 8,421,381 B2 * | 4/2013 | Fukatsu | B60L 53/24 |
| | | | 324/426 |
| 8,421,420 B2 * | 4/2013 | Arai | H02J 7/04 |
| | | | 320/152 |
| 8,428,894 B2 | 4/2013 | Rocci et al. | |
| 8,493,757 B2 | 7/2013 | Carletti et al. | |
| 8,503,204 B2 | 8/2013 | Carletti et al. | |
| 8,503,205 B2 | 8/2013 | Carletti et al. | |
| 8,816,649 B2 | 8/2014 | Davis et al. | |
| 8,947,054 B2 * | 2/2015 | Johnson | H02J 7/0045 |
| | | | 320/140 |
| 8,970,196 B2 | 3/2015 | Henzler | |
| 8,975,886 B2 * | 3/2015 | Shiek | H02M 7/219 |
| | | | 323/285 |
| 9,322,885 B2 * | 4/2016 | Kain | H02J 7/0019 |
| 9,362,774 B2 | 6/2016 | Bornhoft | |
| 9,450,435 B2 * | 9/2016 | Johnson | H02J 7/0045 |
| 9,455,587 B2 | 9/2016 | Schumacher et al. | |
| 9,481,259 B2 * | 11/2016 | Choi | H02M 7/219 |
| 9,637,012 B2 * | 5/2017 | Biagini | B60L 53/20 |
| 9,729,066 B1 * | 8/2017 | Lu | H02M 1/14 |
| 9,887,564 B2 | 2/2018 | Fahlenkamp et al. | |
| 9,893,548 B2 * | 2/2018 | Johnson | H02J 5/00 |
| 9,960,698 B2 | 5/2018 | Nagashima et al. | |
| 10,008,873 B2 * | 6/2018 | Zeier | H02J 7/02 |
| 10,180,460 B1 * | 1/2019 | Castelaz | B60L 58/16 |
| 10,491,132 B2 * | 11/2019 | Johnson | H02J 1/102 |
| 10,562,404 B1 * | 2/2020 | Khaligh | H02M 1/12 |
| 10,809,308 B2 * | 10/2020 | Ballantine | G01R 31/392 |
| 10,989,760 B2 * | 4/2021 | Ballantine | H01M 10/4285 |
| 11,327,119 B2 * | 5/2022 | Pressas | H02J 7/0047 |
| 2003/0085621 A1 | 5/2003 | Potega | |
| 2006/0164037 A1 * | 7/2006 | Kuo | H02J 7/32 |
| | | | 320/115 |
| 2007/0114970 A1 * | 5/2007 | Johnson | H02J 7/0045 |
| | | | 320/128 |
| 2007/0170895 A1 | 7/2007 | Dardik et al. | |
| 2008/0122399 A1 | 5/2008 | Nishino et al. | |
| 2008/0284444 A1 | 11/2008 | Li et al. | |
| 2010/0156357 A1 * | 6/2010 | Hamad | H02J 7/0069 |
| | | | 320/157 |
| 2010/0181963 A1 * | 7/2010 | Schreiber | H02M 5/225 |
| | | | 320/108 |
| 2011/0068746 A1 * | 3/2011 | Rocci | H02J 13/00016 |
| | | | 320/136 |
| 2011/0112782 A1 | 5/2011 | Majima et al. | |
| 2011/0187331 A1 | 8/2011 | Davis et al. | |
| 2011/0215743 A1 * | 9/2011 | Fukatsu | H02J 7/02 |
| | | | 318/139 |
| 2011/0301931 A1 | 12/2011 | Gering | |
| 2012/0200271 A1 | 8/2012 | Henzler | |
| 2012/0300515 A1 | 11/2012 | Carletti et al. | |
| 2012/0306437 A1 * | 12/2012 | Johnson | H02J 5/00 |
| | | | 320/160 |
| 2013/0033910 A1 | 2/2013 | Carletti et al. | |
| 2013/0051096 A1 | 2/2013 | Carletti et al. | |
| 2013/0138373 A1 | 5/2013 | Lee et al. | |
| 2013/0193912 A1 | 8/2013 | Bornhoft et al. | |
| 2013/0314038 A1 * | 11/2013 | Kardolus | B60L 53/20 |
| | | | 320/109 |
| 2014/0028249 A1 | 1/2014 | Larsen et al. | |
| 2014/0247005 A1 | 9/2014 | Graham et al. | |
| 2015/0023064 A1 | 1/2015 | Conseil et al. | |
| 2015/0025822 A1 | 1/2015 | Ladret | |
| 2015/0025825 A1 | 1/2015 | Yoshida | |
| 2015/0108847 A1 | 4/2015 | Taylor et al. | |
| 2015/0115888 A1 * | 4/2015 | Biagini | H02J 7/02 |
| | | | 320/109 |
| 2015/0145520 A1 * | 5/2015 | Kain | G01R 31/389 |
| | | | 324/430 |
| 2015/0155733 A1 * | 6/2015 | Johnson | H02J 7/00711 |
| | | | 320/107 |
| 2015/0229149 A1 | 8/2015 | Fahlenkamp et al. | |
| 2015/0288213 A1 | 10/2015 | Van Lammeren et al. | |
| 2015/0309122 A1 | 10/2015 | Rajamaki et al. | |
| 2016/0181944 A1 | 6/2016 | James et al. | |
| 2016/0268841 A1 * | 9/2016 | Zeier | H02J 7/02 |
| 2016/0344202 A1 * | 11/2016 | Johnson | H02J 5/00 |
| 2017/0187215 A1 | 6/2017 | Noda et al. | |
| 2017/0229897 A1 | 8/2017 | Ashrafzadeh | |
| 2018/0198366 A1 | 7/2018 | Greetham et al. | |
| 2018/0205313 A1 | 7/2018 | Greetham et al. | |
| 2018/0219474 A1 | 8/2018 | Greetham et al. | |
| 2019/0052182 A1 * | 2/2019 | Johnson | H02M 7/5387 |
| 2019/0293723 A1 * | 9/2019 | Pressas | H02J 7/04 |
| 2020/0209317 A1 * | 7/2020 | Ballantine | H01M 10/48 |
| 2020/0209318 A1 * | 7/2020 | Ballantine | H01M 10/482 |
| 2022/0221521 A1 * | 7/2022 | Pressas | H02J 7/04 |

FOREIGN PATENT DOCUMENTS

| | | | |
|---|---|---|---|
| EP | 0546872 | 6/1993 | |
| EP | 1933158 | 6/2008 | |
| EP | 2320538 | 5/2011 | |
| EP | 2364872 | 9/2011 | |
| EP | 2364872 A2 * | 9/2011 | B60L 1/006 |
| GB | 2404258 | 1/2005 | |
| JP | 54-95330 | 7/1979 | |
| JP | H06-113474 | 4/1994 | |
| JP | H09-7641 | 1/1997 | |
| JP | 2006262614 | 9/2006 | |
| JP | 2007-311107 | 11/2007 | |
| JP | 2011-211889 | 10/2011 | |
| JP | 2012-228034 | 11/2012 | |
| KR | 20190115364 | 10/2019 | |
| WO | 9010242 | 9/1990 | |
| WO | 2012165072 | 12/2012 | |
| WO | 2016/043099 | 3/2016 | |
| WO | 2016/050392 | 4/2016 | |

OTHER PUBLICATIONS

International Search Report and Written Opinion for International Application No. PCT/GB2017/052143, ISA/EPO, dated Jan. 2, 2018, 17 pages.

Patents Act 1977: Further Search Report under Section 17 for United Kingdom Application No. GB 1612874.6, dated Jul. 5, 2017, 2 pages.

Patents Act 1977: Search Report under Section 17 for United Kingdom Application No. GB1612874.6, dated Feb. 5, 2017, 2 pages.

Notification of Reason(s) for Rejection regarding corresponding JP Application No. 2019-524528, dated Feb. 10, 2021.

Notification of the Second Office Action regarding corresponding CN Application No. 201780058047.5, dated Jun. 8, 2021.

Communication Pursuant to Rule 164(2)(b) and Article 94(3) EPC regarding corresponding EP Application No. 17742533.7, dated Jul. 21, 2021.

(56) References Cited

OTHER PUBLICATIONS

Notification of Reason(s) for Rejection regarding corresponding JP Application No. 2019-524528, dated Jan. 4, 2022.
Decision of Rejection regarding corresponding CN Application No. 201780058047.5, dated Dec. 24, 2021.
"Applications of Microprocessors in Detection and Control," Published by Shanghai Science and Technology Literature Publishing House, 10 pages including English Translation, Feb. 1992.
Search and Examination Report regarding corresponding GB Application No. 1612874.6, dated Feb. 24, 2022.

* cited by examiner

BATTERY CHARGING CIRCUIT AND METHOD

CROSS-REFERENCE TO RELATED APPLICATIONS

This application is a continuation of U.S. Non-Provisional patent application Ser. No. 16/318,915, filed Jan. 18, 2019, which is a 371 Application based on PCT Application Serial No. PCT/GB2017/052143, filed Jul. 20, 2017, which claims priority to GB 1612874.6, filed on Jul. 25, 2016 and EP 16386011.7, filed Jul. 21, 2016. Priority is claimed to these applications, and they are incorporated herein by reference in their entireties.

DESCRIPTION OF INVENTION

Embodiments of the present invention relate to methods and systems for use in the charging of batteries.

A basic battery charging system for recharging a battery (such as lithium ion battery) may conventionally apply constant or pulsed electrical power to terminals of the rechargeable battery. Typically, a charging cycle for a lithium ion battery may include an initial constant current operation during which the battery charging system is controlled to achieve a substantially constant supply current to the battery during a first period of the charging cycle. Once the voltage across the terminals of the battery has reach a predetermined level, then a conventional battery charging system is typically controlled to achieve a constant voltage or even a constant power across those terminals during this second period of the charging cycle (i.e. a constant voltage operation of the charging cycle). Finally, once the battery is substantially fully charged, then either the charging cycle is terminated or a maintenance or standby operation may be maintained with an occasional supply of electrical power to the battery to compensate for self-discharge.

Most conventional chargers switch from the constant current to the constant voltage or even a constant power operations of the charging cycle with the battery between 60% and 80% of being full charged.

Without wishing to be bound by theory it is believed that ions passing from a positive electrode, of a battery being recharged, to a negative electrode of that battery tend to pile-up prior to intercalation at or towards the boundary of the negative electrode which is towards the positive electrode (i.e. at a solid-electrolyte interphase (SEI) layer). This pile-up is believed to slow the intercalation of the ions in the negative electrode and creates a higher electrical resistance in the battery.

Conventional charging also typically causes the SEI layer to grow (i.e. to thicken) which eventually, when sufficiently thick following a number of charging cycles, will cause a reduction in the charge capacity of the battery and eventually the failure of the battery.

Conventional battery charging systems use relatively complex electronic circuits in order to provide the constant voltage or even a constant power and current operations required for the conventional charging cycles and require additional electronic circuits to provide power factor correction. These complex electronic circuits use numerous relatively expensive components.

Accordingly, there is a desire to alleviate one or more problems associated with conventional battery charging cycles and systems.

As such, an aspect of the present invention provides a method for charging a battery, the method comprising the steps of: providing a charging current to the battery; determining a property of the battery substantially continuously during charging; and varying a property of the charging current in dependence on the determined property of the battery. By measuring battery properties substantially continuously, the charging current supplied to the battery to be varied in substantially real-time to provide a more optimal battery charging current, allowing for a safe minimisation of the battery charging time. In general, more than one battery property can be determined to provide information about the battery state that can assist in determining the charging current properties required. Optionally, the charging current has an oscillating DC waveform. Optionally, the charging current has a pulsed DC waveform. Using a time varying DC charging current such as these can allow for properties, such as the internal impedance of the battery, to be more easily measured without interrupting the charging process. For efficiency, at least a portion of the waveform has substantially the form of rectified sine wave. Optionally, at least a portion of the waveform has substantially the form of a squared sine wave. These wave forms can provide favourable battery charging with a high power factor while being simple to generate. Optionally, the waveform has a minimum occurring at a current value of less than about 0.5 amps, preferably less than about 0.1 amps, more preferably about zero amps. By having a waveform that has a minimum of about zero amps, the effects of static build and/or an internal potential up on the battery properties can be reduced. Optionally, the determined property is determined from the current waveform. The current waveform is relatively straightforward to measure, and can be used to determine further properties of the battery. Optionally, the determined property is determined at at least the frequency of the waveform. Determining the property at at least the frequency of the waveform provide substantially continuous monitoring of the battery properties, with the properties being determined a minimum of once per waveform cycle. This allows for the charging current to be updated frequently, or substantially continuously, in order to prevent any overloading of the battery. Optionally, the determined property is determined during a rising portion of the waveform. For accuracy, the determined property is determined from a measurement starting at a waveform minimum. The waveform minimum provides a convenient start point for measurements, and can result in greater measured changes in properties, and therefore a reduced fractional error. Optionally, the determined property is determined during a falling portion of the waveform. Measuring the property during the falling part of the waveform in addition to the rising part of the waveform allows the property to be determined from a different start point, which can help to detect or reduce errors. Optionally, the waveform is provided at a frequency of about an integer multiple of a voltage supply frequency. Providing a waveform at an integer multiple of the mains voltage supply can result in a higher power factor, increasing the efficiency of the charging. Optionally, the waveform is provided at a frequency of about twice a mains voltage supply frequency, which can provide more efficient charging. Optionally, the waveform is locked to the mains voltage supply frequency. By providing a waveform locked to the mains frequency, by which it is meant that the minimum of the current waveform and zeros of the voltage waveform occur at substantially the same time, a higher power factor can be provided. Optionally, the determined property of the battery comprises a battery internal impedance. The internal impedance can be used to indicate the state of the battery. Optionally, the battery internal impedance is determined from a measured change in current and a measured change in voltage at the battery. This allows the internal impedance to be measured indirectly. Optionally, the determined property of the battery comprises a cell internal impedance. Optionally, the determined property of the battery comprises a maximum cell impedance. Where the battery comprises multiple cells, the cell impedances can be different for each cell. The cell with the highest impedance will determine the limits of a safe charging current. Optionally, the determined property of the battery comprises a battery temperature. Optionally, the determined properties of the battery comprises a cell temperature. The battery and/or cell temperature can indicate information about the state of the battery and/or cell, for example whether the currently used charging current is safe. Optionally, the varied property comprises at: a current mean value; a current maximum value; a current amplitude; a duty cycle; and/or a charging mode. Varying these properties of the current can alter the power supplied to the battery, keeping it within safe limits while minimising the battery charge time. Optionally, the method further comprises the step of measuring the time the battery has been charging, thereby to determine a charge received by the battery. This allows the state of charge of the battery to be monitored. Optionally, the battery is a lithium-ion battery. Lithium ion batteries are used in a wide range of applications. According to another aspect of the present invention, there is provided a battery charging system comprising: a current source, suitable for providing a charging current to a battery: and a control unit; wherein the control unit is configured to determine a property of the battery substantially continuously during charging; wherein the control unit is configured to vary a property of the charging current in dependence on the determined property of the battery. The control unit allows the charging current to be varied based on the substantially continuously determined property of the battery to provide a charging current with properties that are efficient for charging while also being within safe limits so as not to damage the battery. Optionally, the charging current is provided as an oscillating DC waveform. Optionally, the charging current is provided as a pulsed DC waveform. Using a time varying DC charging current such as these can allow for properties, such as the internal impedance of the battery, to be more easily measured without interrupting the charging process. Optionally, at least a portion of the waveform has substantially the form of rectified sine wave. Optionally, at least a portion of the waveform has substantially the form of squared sine wave. These wave forms can provide favourably battery charging while being simple to generate. Optionally, the waveform has a minimum occurring at a current value of less than about 0.5 amps, preferably less than about 0.1 amps, more preferably about zero amps. This can reduce the effects of static build and/or an internal potential up on the battery properties. For efficiency, the determined property is determined from the current waveform. The current waveform is relatively straightforward to measure, and can be used to determine further properties of the battery. For safety, one or more of the determined properties are determined at at least the frequency of the waveform. Optionally, one or more of the determined properties are determined at at least twice the frequency of the waveform. Determining the property at at least the frequency of the waveform provide substantially continuous monitoring of the battery properties, with the properties being determined a minimum of once per waveform cycle. This allows for the charging current to be updated frequently, or substantially continuously, in order to prevent any overloading of the battery. Optionally, the determined property is determined during a rising portion of the waveform. For accuracy, the determined property is determined from a measurement starting at a waveform minimum. The waveform minimum provides a convenient start point for measurements, and can result in greater measured changes in properties, and therefore a reduced fractional error. Optionally, the determined property is determined during a falling portion of the waveform. Measuring the property during the falling part of the waveform in addition to the rising part of the waveform allows the property to be determined from a different start point, which can help to detect or reduce errors. For ease of generation, the waveform is provided at a frequency of an integer multiple of a voltage supply. Optionally, the waveform is provided at a frequency of about twice the voltage supply. Optionally, the waveform is provided at a frequency locked with the voltage supply. This provides a high power factor, increasing efficiency. Optionally, the current source comprises a flyback converter. Use of a flyback converter to produce the current waveform can reduce or remove the requirement for bulking capacitors to produce the charging current. Optionally, the system further comprises a voltage measurement means and/or a current measurement means. Determining the current and voltage, or the current changes and voltage changes, can allow for properties of the battery to be determined without interrupting the supply of current to the battery. Optionally, to indicate the state of the battery the one or more determined properties of the battery comprises a battery internal impedance. The internal impedance can be used to indicate the state of the battery. Optionally, the battery internal impedance is calculated from a measured change in current and a measured change in voltage across the battery. This allows the internal impedance of the battery to be determined indirectly. Optionally, the determined property of the battery comprises one or more cell internal impedances. Optionally, the determined property of the battery comprises a maximum cell impedance. Where the battery comprises multiple cells, the cell impedances can be different for each cell. The cell with the highest impedance will determine the limits of a safe charging current. Optionally, the determined property of the battery comprises a battery temperature. The battery and/or cell temperature can indicate information about the state of the battery. Optionally, the varied property comprises at least one of: a current mean value; a current maximum value; a current amplitude; a duty cycle; and/or a charging mode. Varying these properties of the current can alter the power supplied to the battery, keeping it within safe limits while minimising the battery charge time. Optionally, the system further comprises a clock, wherein the clock is configured to measure the time the battery has been charging, thereby to determine a charge received by the battery. This allows the state of charge of the battery to be monitored. To enable self-learning and updating, the control unit can be configured to store a plurality of the determined properties of the battery in a database and/or look-up table. According to a further aspect of the present invention, there is provided a method for monitoring the internal impedance of a battery during charging, the method comprising the steps of: providing a time varying current to the battery; measuring a change in current substantially continuously; measuring a corresponding change in voltage substantially continuously; and determining the internal impedance of the battery from the change in current and the corresponding change in voltage. Optionally, the time varying current is provided in the form of an oscillating DC waveform. Optionally, at least a portion of the waveform has substantially the form of squared sine wave. These wave forms can provide favourably battery charging while being simple to generate. Optionally, for accuracy the waveform has a minimum occurring at a current value of less than about 0.5 amps, preferably less than about 0.1 amps, more preferably about zero amps. This can reduce the effects of static build and/or an internal potential up on the measurement of the current change and voltage change. Optionally, the impedance is determined at at least the frequency of the waveform. This provides a substantially continuous determination of the battery impedance. Optionally, the change in current and/or change in voltage are measured during a rising portion of the waveform. For accuracy, the change in current and/or change in voltage are measured starting at a waveform minimum. The waveform minimum provides a convenient start point for measurements, and can result in greater measured changes in current, and therefore a reduced fractional error. For flexibility, the change in current and/or change in voltage are measured during a falling portion of the waveform. According to a further aspect of the present invention, there is provided a battery charger, the battery charger being adapted to provide a current with an oscillating waveform, wherein the waveform minima are at or near 0 A. Optionally, the waveform minima are at less than 0.1 A, more preferably at less than 0.01 A and yet more preferably at less than 0.001 A. Providing waveform minima at or near 0 A can reduce the build-up of static charges and/or internal potentials in the battery. Optionally, the peak-to-peak current is greater than 1 A, and preferably between about 10 A and about 30 A. Providing a large peak-to-peak current can increase the accuracy of the impedance measurement. For accuracy, per oscillation cycle of the waveform at least 0.5 ms are at or near 0 A, preferably at least 1 ms more preferably at least 5 ms, and yet more preferably at least 10 ms. For accuracy, per oscillation cycle of the waveform at least 0.5% of the cycle period is at or near 0 A, preferably at least 1%, more preferably at least 5%, and yet preferably at least 10%. Optionally, a plurality of battery charging systems are provided, and each battery charging system is configured to receive an input from a single phase of a multi-phase input and to generate a common output. According to a further aspect of the present invention, there is provided a method of charging a battery, the method comprising converting an AC power source to a charging current to a battery, wherein the current has an oscillating waveform, and the waveform minima are at or near 0 A. Optionally, the waveform is according to one or more of the waveforms described above in relation to other aspects of the invention. According to another aspect there is provided a battery charger for providing a charging current to a battery, the battery charger comprising a switched-mode power converter and a controller adapted to vary the switching frequency and/or the duty cycle to provide a current with a desired wave form. By varying the switching frequency and/or the duty cycle the current provided can vary over time; this can enable providing a current with a desired wave form. Battery charging with a particular wave form can be beneficial for a number of reasons including optimisation of current uptake by the battery, reduction of battery heating, evaluation of battery health, reduction of battery charging time, and optimisation of battery lifespan. The controller may be adapted to vary the switching frequency and/or the duty cycle after one or more duty cycles of the switched-mode power converter. By varying the switching frequency and/or the duty cycle relatively frequently, smooth wave forms can be achieved. For smooth wave forms the controller may be adapted to vary the switching frequency and/or the duty cycle after each duty cycle of the switched-mode power converter. The controller may be adapted to vary the switching frequency and/or the duty cycle in dependence on a voltage oscillation of an AC power source. This can enable efficient generation of an oscillating current wave form. Because of the dependency a high power factor can be achieved. This can avoid the necessity for power factor correction hardware, which can be bulky, large, and heavy. The controller may be adapted to vary the switching frequency and/or the duty cycle multiple times during each voltage oscillation of the AC power source, preferably at least three times during each voltage oscillation, preferably at least 10 times, more preferably at least 100 times during each voltage oscillation, and yet more preferably at least 800 times during each voltage oscillation. This can enable good replication of the voltage oscillation. For accuracy the battery charger may further comprise a voltage sensor adapted to provide an indication of a voltage of an AC power source to the controller. For accuracy the voltage sensor may be adapted to sense the voltage at least as often as the controller varies the switching frequency. The switching frequency and/or the duty cycle may be varied in dependence on a rectified (preferably full-wave rectified) voltage oscillation of the AC power source. Rectification can double the oscillation frequency and ensure the oscillation does not change polarity, which is favourable for varying the switching frequency in dependence on the voltage oscillation. The desired wave form may have a frequency of about an integer multiple of a frequency of the AC power source, preferably about twice a frequency of the AC power source. This can provide particularly efficient generation of an oscillating current wave form with a particularly high power factor. For efficiency the desired wave form may be locked to a frequency of the AC power source. The desired wave form may be a sine wave, a full-wave rectified sine wave, a squared sine wave, or a combination thereof. These wave forms can provide favourably battery charging while being simple to generate. The switched-mode power converter may be a flyback transformer. A flyback transformer can accommodate a suitable switching frequency and/or duty cycle range. For effectiveness the switched-mode power converter may be adapted for operation in a critical conduction mode. The switching frequency and/or the duty cycle may be varied within a range of 1 to 1000 kHz, and preferably within a range of 10 to 500 kHz, and more preferably within a range of 40 to 200 kHz. This is comparatively higher than typical mains power supply frequencies of 50 or 60 Hz and rectified frequencies of 100 or 120 Hz, and so can enable smooth generation of desired wave forms with frequencies between 25 and 150 Hz. For adaptability the controller may be adapted to vary the switching frequency and/or the duty cycle in dependence on a desired maximum charging current to a battery. The desired maximum charging current may be dependent on one or more of: a battery temperature; a battery voltage; a battery current; a battery voltage change; a battery current change; a battery impedance; a charging time; and an accumulated battery charge. These can be particularly indicative of conditions or circumstances where a relatively high or low charging current might be advantageous. The controller may be adapted to vary the switching frequency and/or the duty cycle such that a minimum charging current provided to a battery is less than 1 A, preferably less than 0.1 A, more preferably less than 0.01 A and yet more preferably approximately 0 A. This can reduce hysteresis effects and enable favourable battery behaviour and charging. The controller may be adapted to vary the switching frequency and/or the duty cycle such that a peak-to-peak current provided to a battery is greater than 1

A, and preferably between about 10 A and about 30 A. This can enable effective charging of batteries such as lithium-ion batteries, batteries for hand-held devices without excessively high and dangerous currents. The battery charger may further comprise a smoother adapted to smooth the output current from the power converter. Each of the plurality of battery chargers may be configured to be connected to a multi-phase input and may be connected to a common output. This can enable generation of a smooth wave form from a rectified wave form. A smooth wave form is favourable for battery charging as it can enable effective charging. According to another aspect there is provided a method of charging a battery, comprising: converting an AC power source to a charging current to a battery with a switched-mode power converter; wherein the switching frequency and/or the duty cycle is varied in dependence on a desired wave form. By varying the switching frequency and/or the duty cycle the current provided can vary over time; this can enable providing a current with a desired wave form. Battery charging with a particular wave form can be beneficial for a number of reasons including optimisation of current uptake by the battery, reduction of battery heating, evaluation of battery health, reduction of battery charging time, and optimisation of battery lifespan. The switching frequency and/or the duty cycle may be varied after one or more duty cycles of the switched-mode power converter, preferably after each duty cycle. By varying the switching frequency relatively frequently, smooth wave forms can be achieved. The switching frequency and/or the duty cycle may be varied in dependence on a voltage oscillation of the AC power source. This can enable efficient generation of an oscillating current wave form. Because of the dependency a high power factor can be achieved. This can avoid the necessity for power factor correction hardware, which can be bulky, large, and heavy. The switching frequency and/or the duty cycle may be varied multiple times during each voltage oscillation of the AC power source, preferably at least three times during each voltage oscillation, preferably at least 10 times, more preferably at least 100 times, and yet more preferably at least 800 times during each voltage oscillation. This can enable good replication of the voltage oscillation. For accuracy the method may further comprise sensing a voltage of an AC power source and varying the switching frequency and/or the duty cycle in dependence on the voltage, and preferably comprising sensing the voltage at least as often as the switching frequency is varied. The switching frequency and/or the duty cycle may be varied within a range of 1 to 1000 kHz, and preferably within a range of 10 to 500 kHz, and more preferably within a range of 40 to 200 kHz. This is comparatively higher than typical mains power supply frequencies of 50 or 60 Hz and rectified frequencies of 100 or 120 Hz, and so can enable smooth generation of desired wave forms with frequencies between 25 and 150 Hz. The switching frequency and/or the duty cycle may be varied in dependence on a rectified (preferably full-wave rectified) voltage oscillation of the AC power source. Rectification can double the oscillation frequency and ensure the oscillation does not change polarity, which is favourable for varying the switching frequency in dependence on the voltage oscillation. For adaptability the switching frequency and/or the duty cycle may be varied in dependence on a desired maximum charging current to a battery, optionally wherein the desired maximum charging current is dependent on one or more of: a battery temperature; a battery voltage; a battery current; a battery voltage change; a battery current change; a battery impedance; a charging time; and an accumulated battery charge. These can be particularly indicative of conditions or circumstances where a relatively high or low charging current might be advantageous. The switching frequency and/or the duty cycle may be varied such that a minimum charging current provided to a battery is less than 1 A, preferably less than 0.1 A, more preferably less than 0.01 A and yet more preferably approximately 0 A. This can reduce hysteresis effects and enable favourable battery behaviour and charging. The switching frequency may be varied such that a peak-to-peak current provided to a battery is greater than 1 A, and preferably between about 10 A and about 30 A. According to another aspect there is provided a battery charging system comprising one or more of the following features:

a transformer, preferably including a first primary winding and/or a first secondary winding;

a primary switch device, the primary switch device preferably being configured to control electrical current delivered to a transformer, for example to a first primary winding, from an electrical power supply;

terminals configured to receive electrical power from a transformer, for example from a first secondary winding of a transformer, and configured to be connected to a battery to be charged;

a control sub-system configured to control the operation of a primary switch device;

a control sub-system configured to control a primary switch device such that a transformer provides electrical power to terminals with an electrical current waveform which has a peak-to-peak current of greater than about 1 A;

a control sub-system configured to determine the electrical impedance of a battery to be charged using an electrical current waveform;

a control sub-system configured to control a primary switch device based at least in part on a determined electrical impedance of a battery to be charged;

an electrical current waveform having a frequency of greater than about 60 Hz, preferably about 100 Hz to 120 Hz;

an electrical current waveform having a peak-to-peak current of about 10 A to about 30 A;

an electrical current waveform varying between a low current of about 0 A and a peak current;

an electrical current waveform having a frequency which is substantially twice a frequency of the electrical power supply;

a primary switch device operated according to a frequency and/or duty cycle which is varied based at least in part on an determined electrical impedance of the battery to be charged;

an envelope of one or more pulses of electrical current delivered to a transformer substantially follows a voltage waveform of the electrical power supply;

a transformer is a flyback transformer;

an electrical impedance of a battery to be charged is determined at a frequency of greater than about 60 Hz, and preferably at a frequency of between about 100 Hz and about 120 Hz;

a transformer being connectable to a rectified AC electric power supply;

a control sub-system configured to control a primary switch device such that a transformer provides electrical power to terminals with an electrical current waveform which has a substantially rectified sine waveform current and/or a constant root mean square sine waveform;

a control sub-system configured to control a primary switch device such that a transformer provides electrical power to terminals with an electrical current waveform which has a frequency which is substantially twice a frequency of a voltage of an AC electric power supply.

a control sub-system configured to control a primary switch device to actuate the primary switch device between on- and off-states at frequencies which vary over time; and a control sub-system configured to control a primary switch device to actuate the primary switch device between on- and off-states at frequencies which are dependent on a magnitude of a voltage of an AC electric power supply and/or a magnitude of a battery current and/or on a magnitude of a battery voltage.

According to another aspect there is provided a method of operating a battery charging system comprising one or more of the following features:

the battery charging system includes a transformer, preferably including a first primary winding, a first secondary winding, the battery charging system includes a primary switch device, the primary switch device preferably being configured to control electrical current delivered to a first primary winding from an electrical power supply;

terminals configured to receive electrical power from a first secondary winding of a transformer and configured to be connected to a battery to be charged;

a control sub-system configured to control the operation of the primary switch device:

controlling a primary switch device such that a transformer provides electrical power to terminals with an electrical current waveform which has a peak-to-peak current of greater than about 1 A;

determining an electrical impedance of a battery to be charged using an electrical current waveform;

controlling a primary switch device further based at least in part on a determined electrical impedance of a battery to be charged;

controlling a primary switch device includes controlling a primary switch device such that an electrical current waveform has a frequency of greater than about 60 Hz, and preferably about 100 Hz to 120 Hz;

controlling a primary switch device includes controlling a primary switch device such that an electrical current waveform has a peak-to-peak current of about 10 A to about 30 A;

controlling a primary switch device includes controlling a primary switch device such that an electrical current waveform varies between a low current of about 0 A and a peak current;

controlling a primary switch device includes controlling a primary switch device such that an electrical current waveform has a frequency which is substantially twice a frequency of an electrical power supply;

controlling a primary switch device further includes controlling the primary switch device such that a frequency and/or duty cycle of the primary switch device is varied based at least in part on a determined electrical impedance of a battery to be charged;

controlling the primary switch device includes controlling the primary switch device such that an envelope of one or more pulses of electrical current delivered to a transformer substantially follows a voltage waveform of an electrical power supply; and an electrical impedance of a battery to be charged is determined at a frequency of greater than about 60 Hz, and preferably at a frequency of between about 100 Hz and about 120 Hz.

As used herein, DC preferably refers to a voltage and/or a current with a constant polarity. A DC voltage and/or current may vary in time, for example in a pulsating, oscillating, or otherwise varying waveform. In a switched-mode power converter, variation of the switching frequency results in variation of the duty cycle, and vice versa. Variation of the switching frequency can be achieved by varying the duty cycle, and vice versa. Where variation of the switching frequency is referred to herein, it may be substituted by variation of the duty cycle. The invention extends to a battery charger and/or battery charging system substantially as herein described and/or as illustrated with reference to the figures. The invention also extends to a method for charging a battery substantially as herein described and/or as illustrated with reference to the figures. The invention also extends to a method for determining the impedance of a battery substantially as herein described and/or as illustrated with reference to the figures.

Any apparatus feature as described herein may also be provided as a method feature, and vice versa. As used herein, means plus function features may be expressed alternatively in terms of their corresponding structure.

Any feature in one aspect of the invention may be applied to other aspects of the invention, in any appropriate combination. In particular, method aspects may be applied to apparatus aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

BRIEF DESCRIPTION OF THE DRAWINGS

Embodiments of the present invention are described, by way of example only, with reference to the accompanying drawings, in which.

DETAILED DESCRIPTION

The term "battery" as used herein is to be interpreted as referring to one or more cells capable of storing electrical charge and capable of being recharged following discharge of that electrical charge. If the battery includes multiple cells, then those cells may be connected together in a circuit to form the battery. The circuit may be a series circuit (in which the cells are connected together in series), or a parallel circuit (in which the cells are connected together in parallel), or a series-parallel circuit (in which cells are connected together in series with multiple groups of series connected cells connected in parallel with each other), or any combination of such circuits.

The terms "battery terminals", "battery terminal", "terminal of a battery", and "terminals of a battery" as used herein are to be interpreted as referring to electrical terminal or terminals of the battery through which electrical power may be delivered by the battery to one or more circuits and/or through which electrical power may be provided to the battery in order to recharge the battery.

The terms "anode" and "negative electrode" are used herein substantially interchangeably and are to be interpreted as references to the internal parts of a cell which form the anode of that cell. Similarly, the terms "cathode" and "positive electrode" are used herein substantially interchangeably and are to be interpreted as references to the internal parts of a cell which form the cathode of that cell.

Embodiments of the invention will be described with reference to a "battery" but it will be appreciated that this is typically a reference the operation of and processes in a single cell, and that a battery comprising multiple cells may have a corresponding plurality of anodes and cathodes and similar operations and processes may be occurring in each cell of the battery.

A battery (and, therefore, a cell) as described herein may be a lithium ion battery (or cell) but it is envisaged that embodiments of the present invention may be used with other forms of battery (and cell) too.

With reference to FIGS. 1a and 1b, and again without wishing to be bound by theory, these figures schematically show what is believed to be occurring in a battery during a conventional charging cycle using a constant current operation.

Figure 1A:
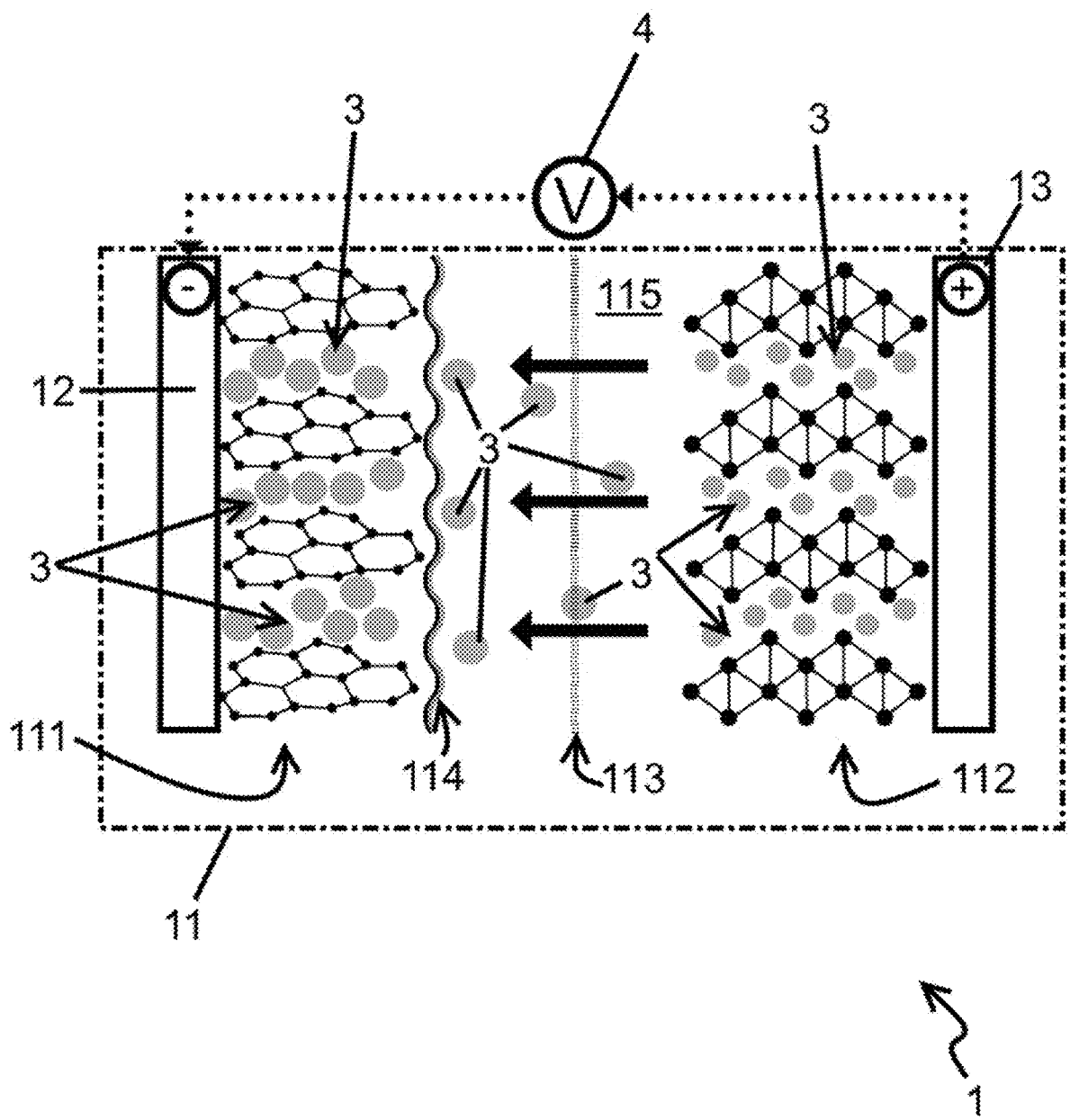
FIGS. 1a and 1b schematically show what is believed to be occurring during conventional charging of a battery.
Figure 1B:
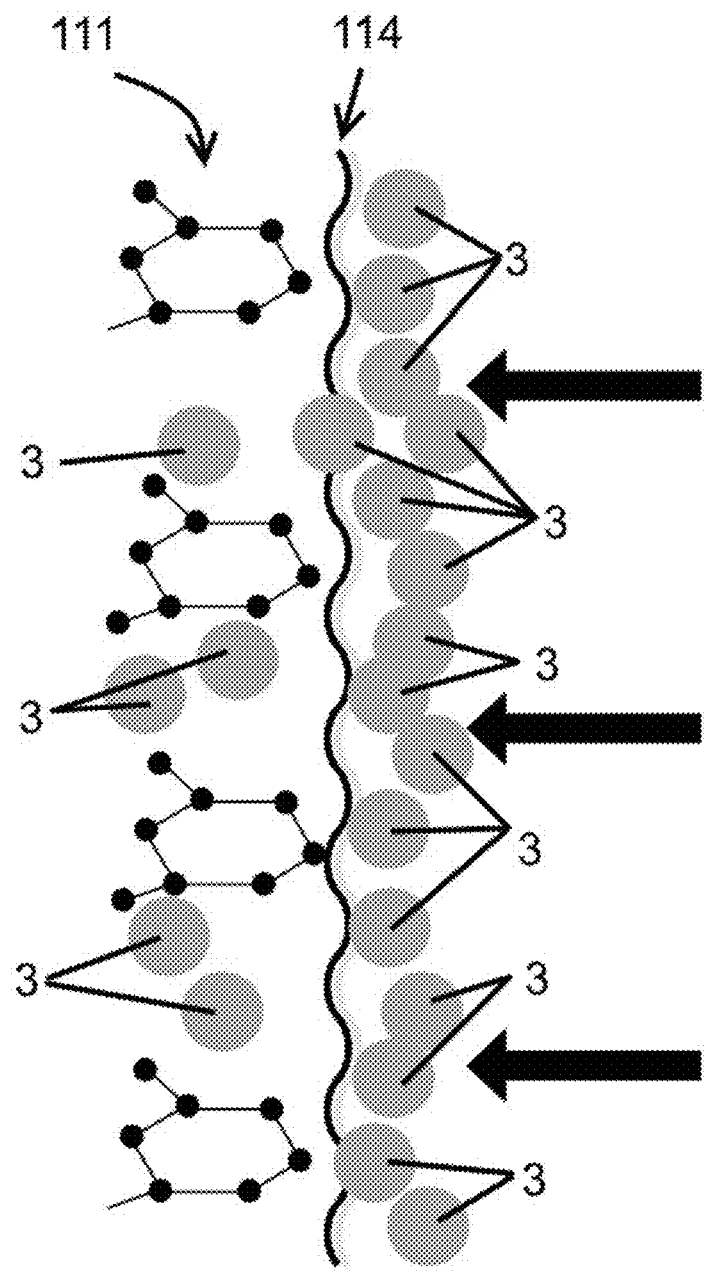

As can be seen from FIGS. 1a and 1b, a battery 1 includes a cell 11 and that cell 11 includes an anode 111 and a cathode 112 in an electrolyte 115. A separator 113 may positioned between the anode 111 and cathode 112. The anode 111 may be connected in electrical communication with a negative terminal 12 of the battery 1 and the cathode 112 may be connected in electrical communication with a positive terminal 13 of the battery 1.

A solid-electrolyte interphase (SEI) layer 114 is located at or towards the boundary of the anode 111.

During charging of the battery 1, an electrical voltage is applied across the terminals 12,13 of the battery 1 to cause ions 3 to pass from the cathode 112, e.g. through the separator 113 and electrolyte 115, to the anode 111 and through the SEI layer 114 to intercalate in the anode 111 (during discharge, of course, the flow of ions 3 is in the opposite direction within the battery 1).

It is believed that the ions 3 cannot intercalate in the anode 111 as quickly as they are supplied to the SEI layer 114 under a conventional charging cycle during a constant current operation. Therefore, a pile-up of ions 3 occurs at or towards the boundary of the anode 111 (i.e. in the region of the SEI layer 114). This is schematically represented in FIG. 1b.

As explained herein, it is believed that this—in turn—increases the electrical resistance within the battery 1 and/or causes growth of the SEI layer 114. This is believed to cause additional heating of the battery 1 during the charging cycle which, again, has an impact on speed at which the battery 1 can be charged, the nature of the charging cycle which can be used, the efficiency of the charging process, the safety of the charging process, and/or the lifespan of the battery in terms of the number of charging cycles which the battery 1 can undergo before charge capacity drops below acceptable levels.

Figure 2:
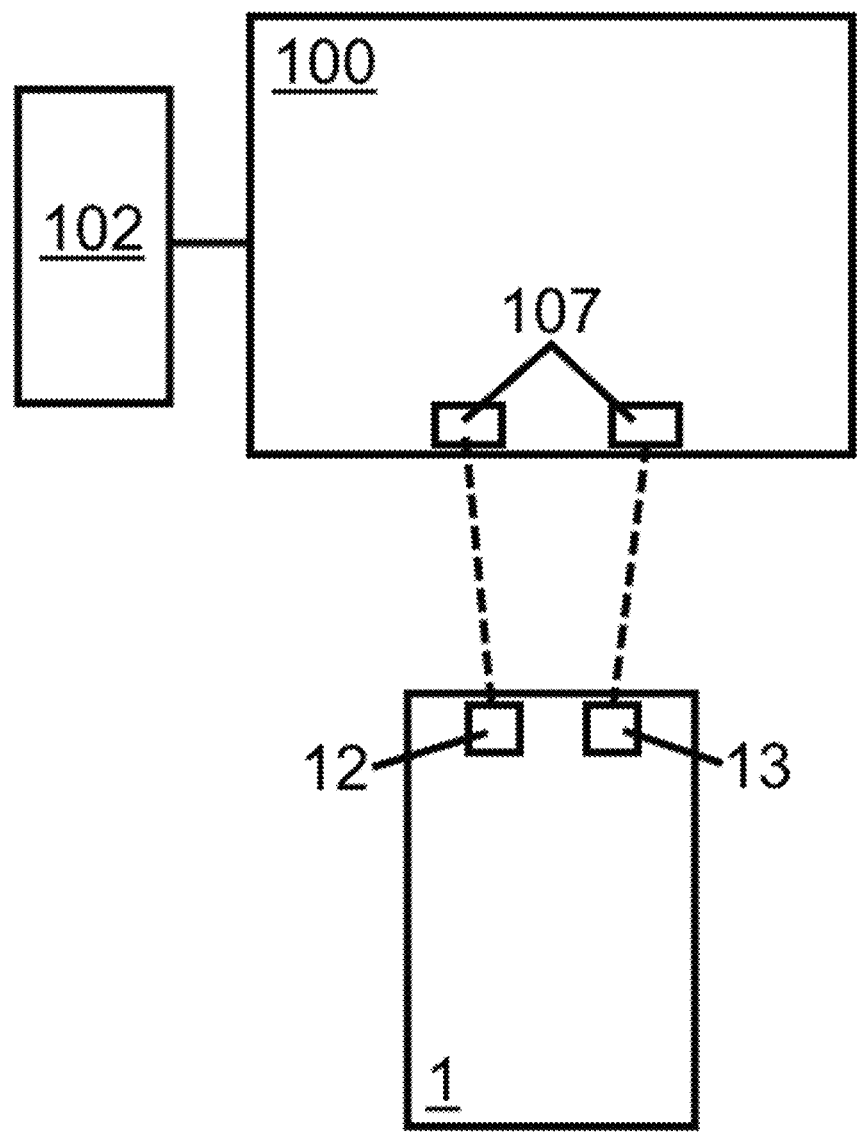
FIG. 2 shows an embodiment of the present invention.

With reference to FIG. 2, embodiments of the present invention, therefore, include a battery charging system 100 which is configured to supply electrical current to the battery 1, also referred to as a charging current, wherein the electrical current may be of a waveform of varying amplitude with a generally non-zero mean average current and may be a waveform with a substantially constant mean average current (and that waveform may be substantially sinusoidal for example). Further examples of a suitable waveform include an oscillating DC waveform or a pulsed DC waveform. Such a waveform can, for example, be supplied by a switched-mode power converter along with a controller adapted to vary the switching frequency to provide a current with a desired waveform.

Figure 3A:
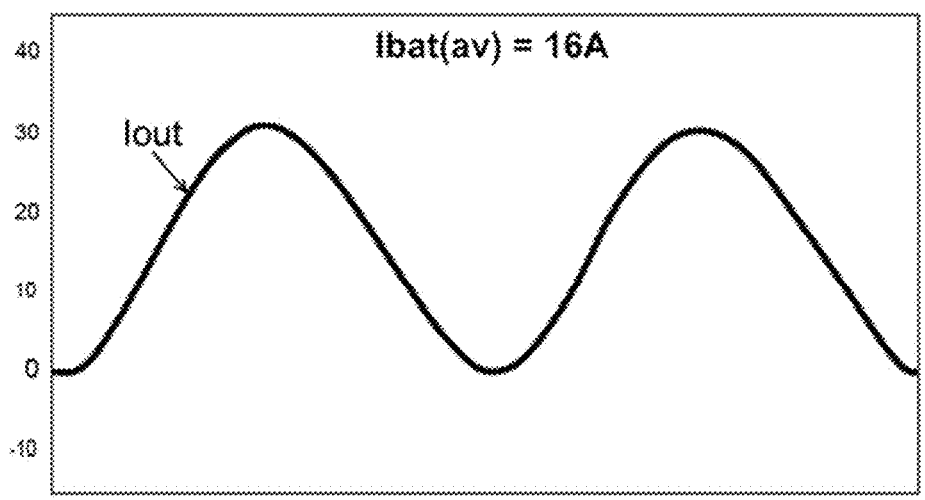
FIGS. 3a-3f show graphical representations of currents and voltages during operation of embodiments.
Figure 3B:
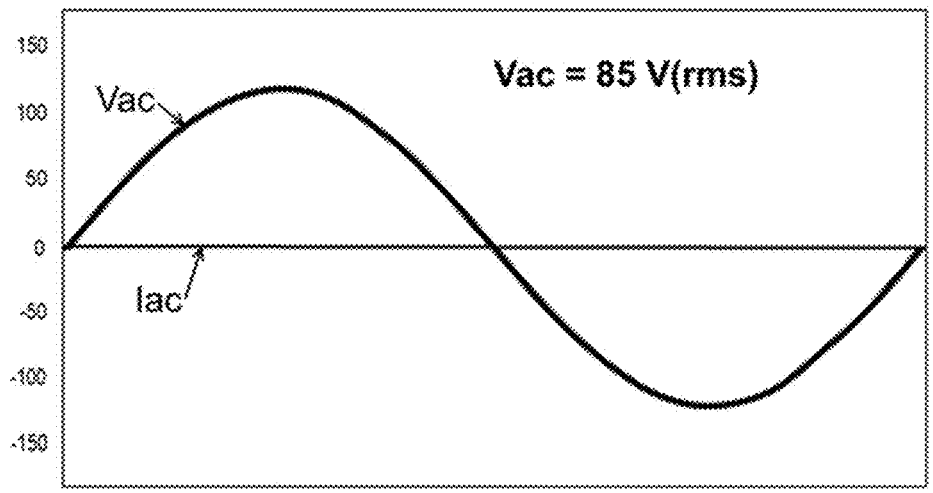
Figure 3C:
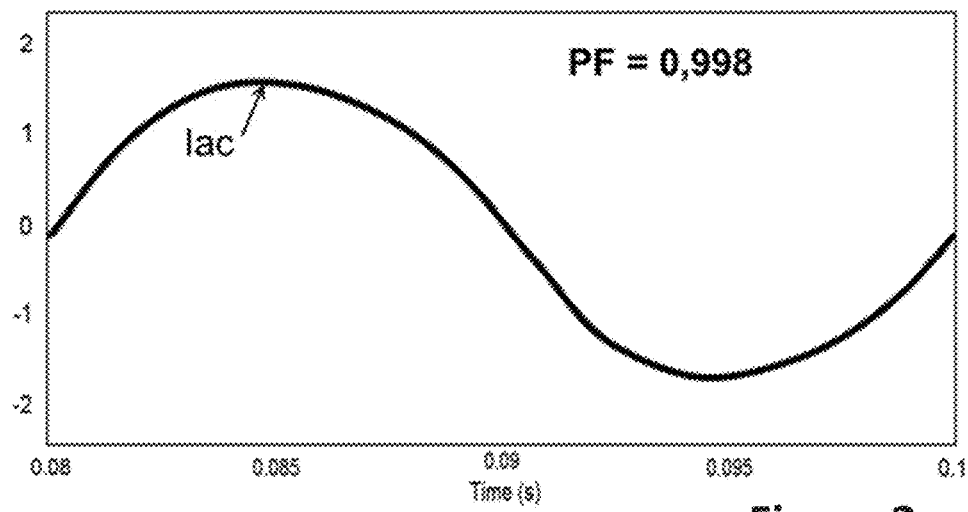
Figure 3D:
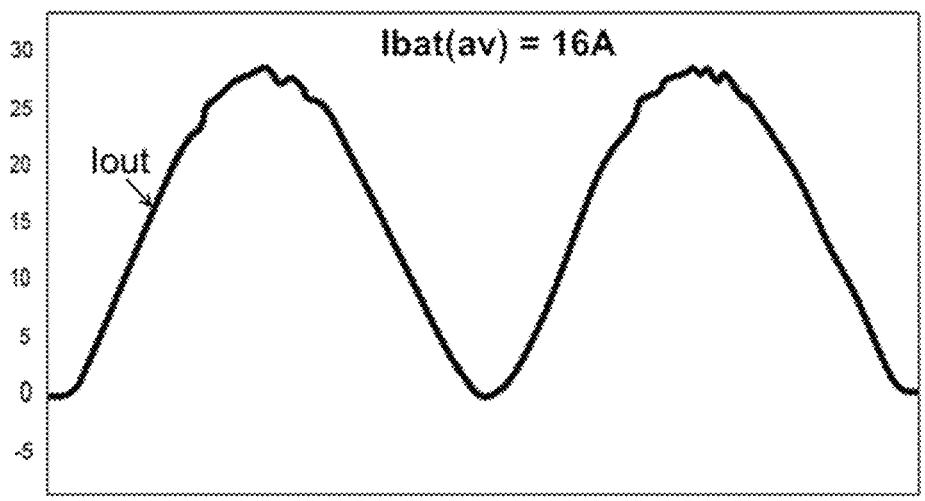
Figure 3E:
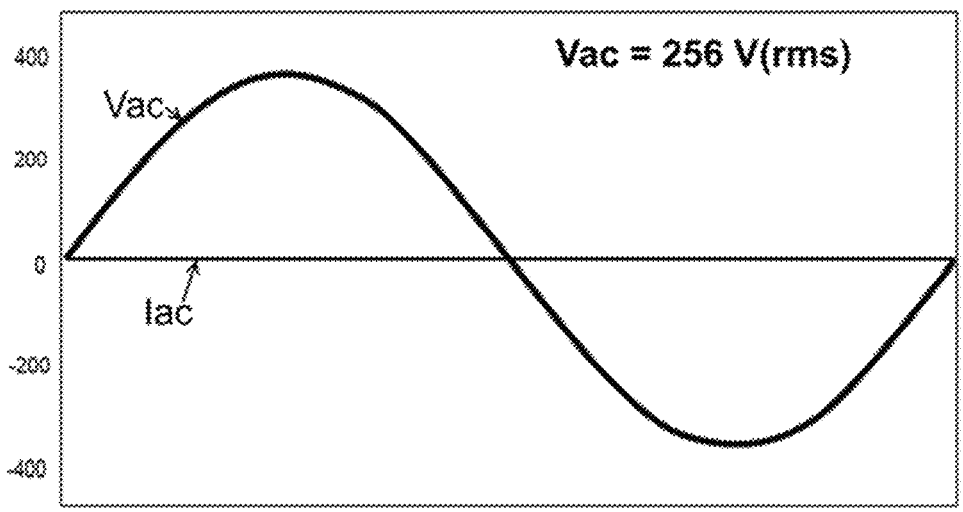
Figure 3F:
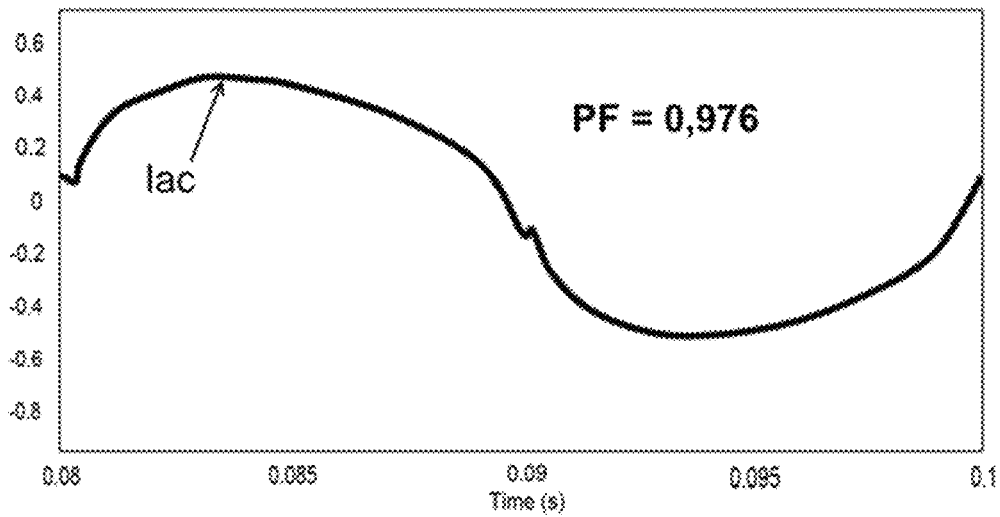
Figure 4:
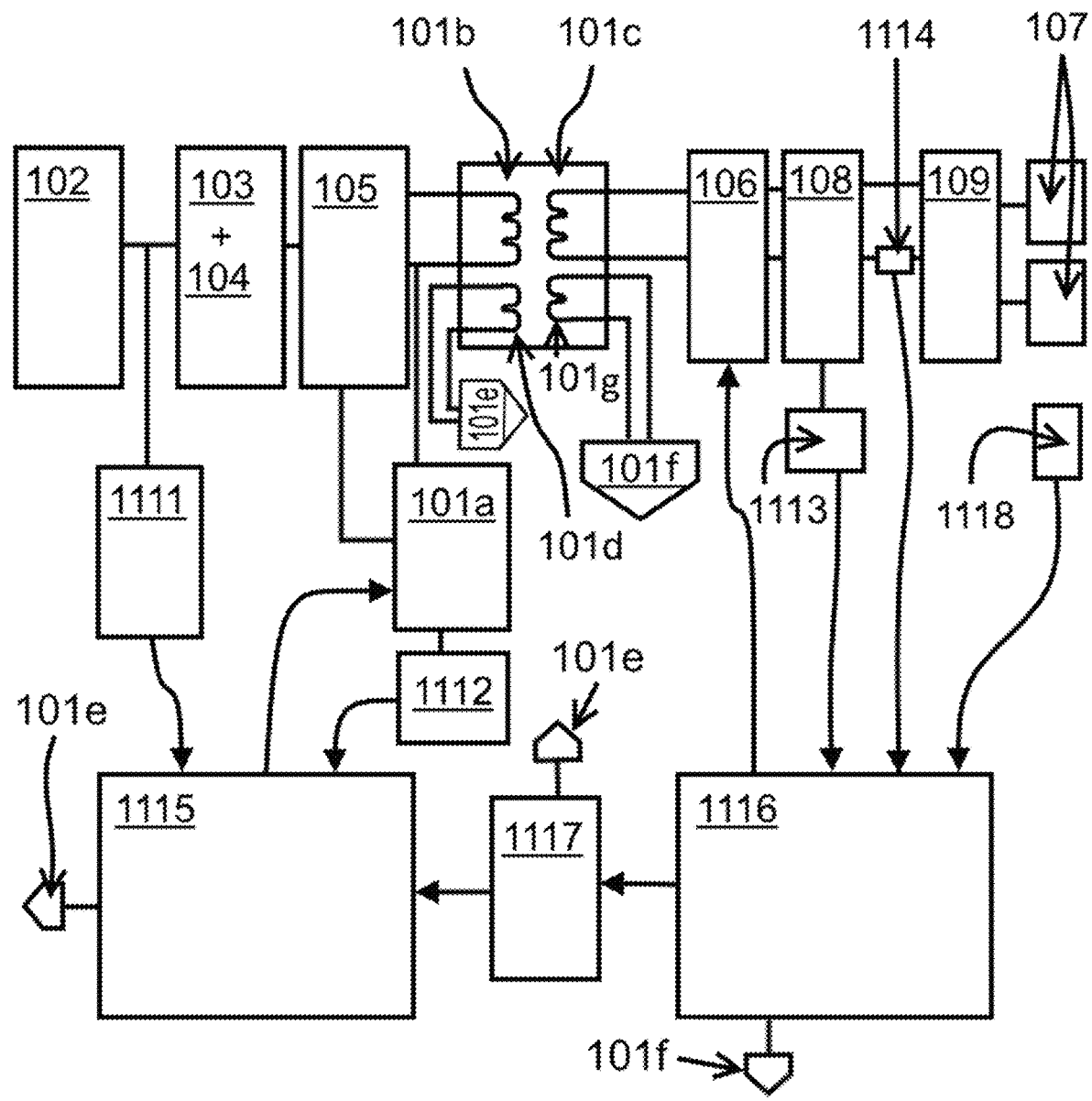
FIGS. 4-7 shows a battery charging system according to some embodiments and parts thereof.
Figure 5:
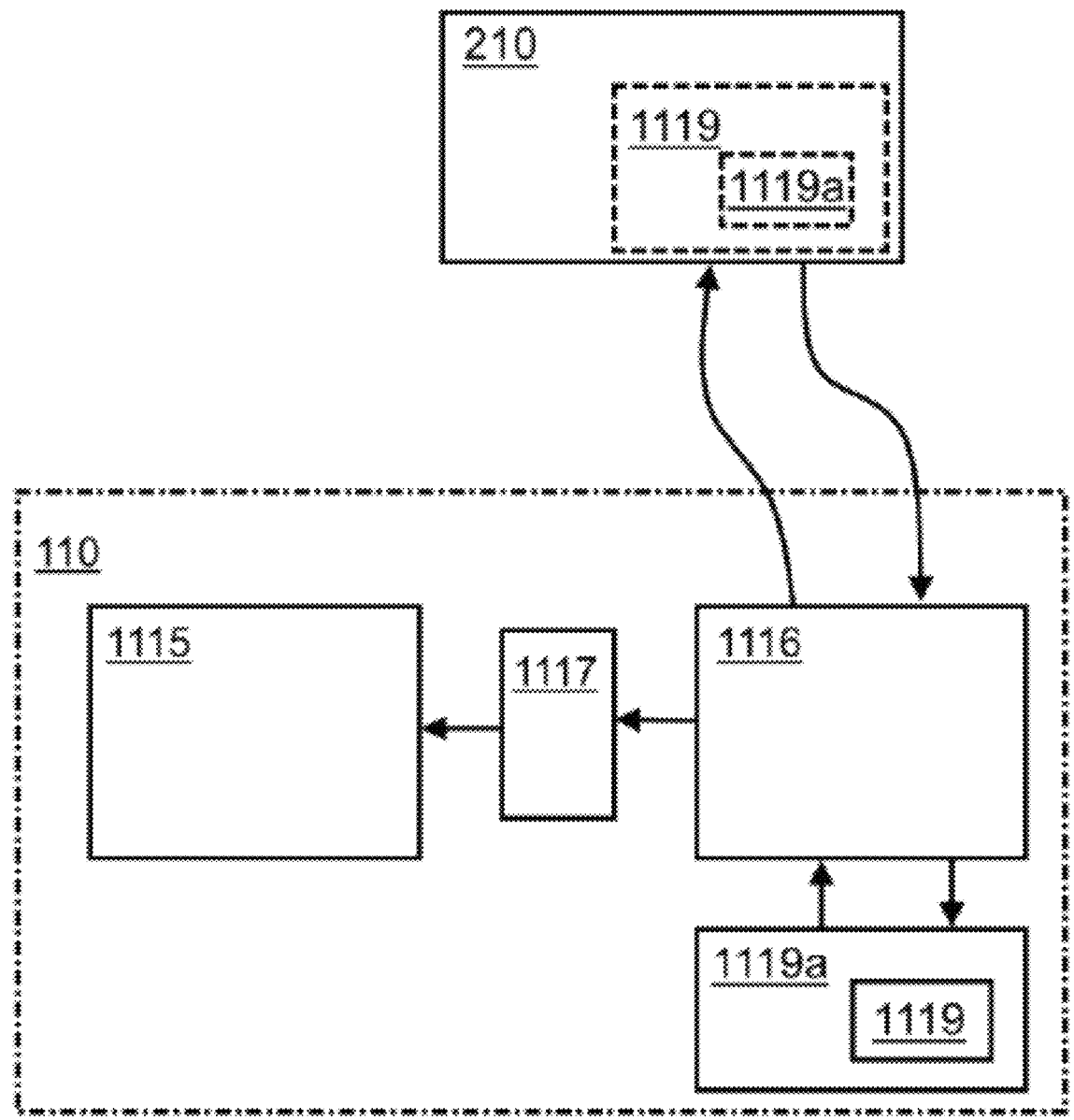
Figure 6:
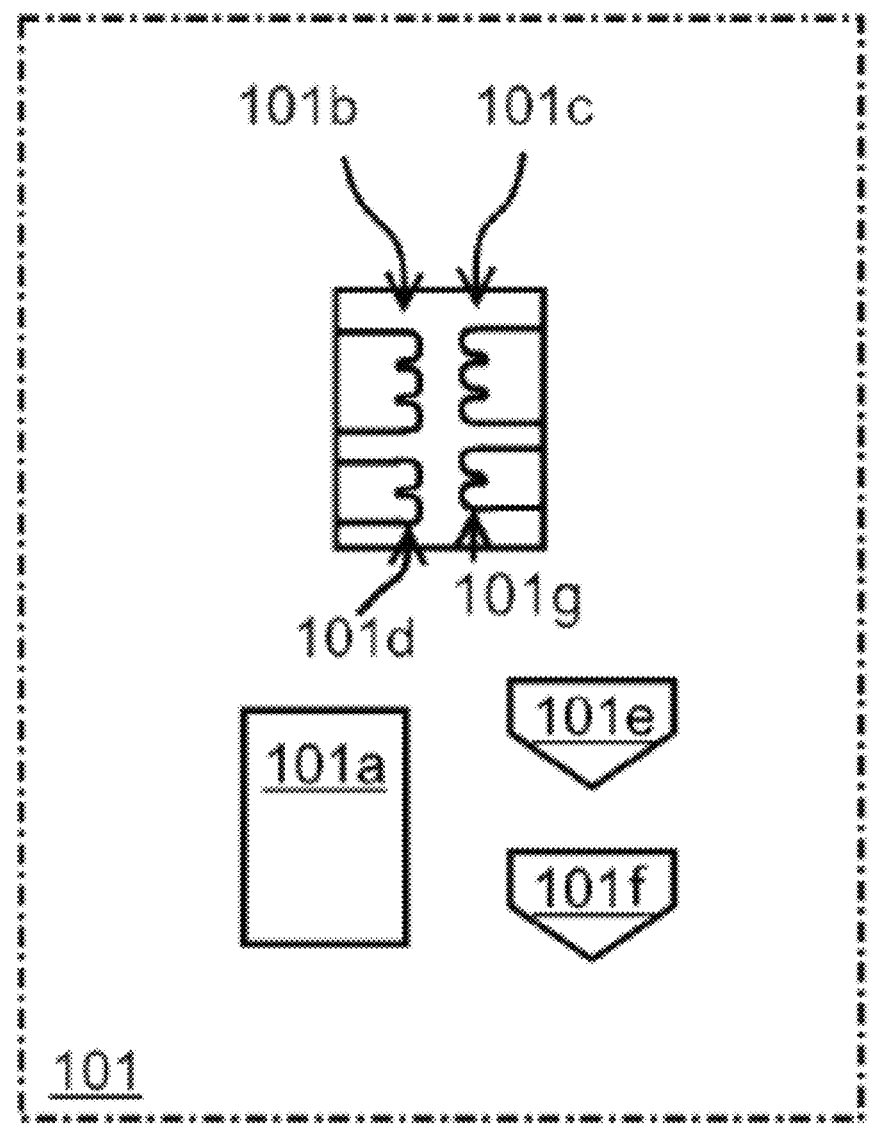

FIGS. 3a-3c show the electrical current delivered to the battery 1 by the battery charging system 100 of some embodiments (FIG. 3a), the voltage of the mains power supply 102 (FIG. 3b), and the current drawn from the electrical power supply (FIG. 3c), for a mains power supply 102 with an RMS voltage of about 85V. FIGS. 3d-4f show the electrical current delivered to the battery 1 by the battery charging system 100 of some embodiments (FIG. 3d), the voltage of the mains power supply 102 (FIG. 3e), and the current drawn from the electrical power supply (FIG. 3f), for a mains power supply 102 with an RMS voltage of about 265V.

The frequency of the electrical current supplied to the battery 1 by the battery charging system 100 may be generally about twice the frequency of an electrical power supply to the battery charging system 100 and/or the electrical current supplied to the battery 1 by the battery charging system 100 may have a waveform substantially corresponding to a rectified form of a waveform of a supply voltage (e.g. a full-wave rectified form). The frequency of the electrical current supplied to the battery 1 may be, for example, 100 Hz or 120 Hz. The magnitude of the current supplied to the battery 1 may be generally equal to the peak current supplied to the battery 1.

Accordingly, in embodiments of the present invention, the battery charging system 100 may be configured to supply electrical power to the battery 1 during a charging cycle in a first operation as described above. The battery charging system 100 may be configured to supply electrical power to the battery 1 during the same charging cycle in a second operation in which, for example, the electrical power is supplied with a substantially constant voltage or even a constant power.

As can be seen from the examples in FIGS. 3a-3c and 4a-4c, the electrical power supply voltage ($V_{ac}$) may be typical of the mains AC electrical supply voltage which is available in many countries—the voltage and frequency of which may be different in different countries (e.g. 85-265V RMS, and 50-60 Hz). $V_{ac}$ is, therefore, typically of sinusoidal form centred on 0V. The electrical current ($I_{bat}$) supplied to the battery 1 may have a waveform which has a frequency which is related to that of $V_{ac}$ and which may be, for example, substantially twice the frequency of $V_{ac}$, or about an integer multiple of the frequency of $V_{ac}$. The electrical current ($I_{bat}$) supplied to the battery 1 may have a non-zero mean average (i.e. may have an offset from 0 A) and may be of a generally sinusoidal form—as described herein. The electrical current ($I_{bat}$) may be generally of the form of a full-wave rectified waveform of the supply voltage $V_{ac}$ and so, in some embodiments, the lower peaks of the waveform may be sharper than depicted in FIGS. 4a and 4b, for example.

The waveform of the electrical current, $I_{bat}$, supplied to the battery 1, may vary between a low current (i.e. the lowest current of the waveform) and a peak current (i.e. the highest current of the waveform). The low current may be substantially 0 A. The peak current may be between about 1 A and about 30 A, or between about 10 A and about 30 A, or between about 20 A and about 30 A. The peak-to-peak variation in the electrical current, $I_{bat}$, supplied to the battery 1 (i.e. the difference between the peak current and the low current) may be greater than about 1 A, or greater than about 10 A, or greater than about 20 A or about 30 A. Generally this peak battery charging current is about 10 times the capacity of the battery. For example, the battery we use is 2.6 Ah. Thus the peak current is about 26 Amps, giving an average battery charging current of about 16 Amps.

The waveform of the electrical current, $I_{bat}$, may repetitively oscillate between the low current and the peak current. In some embodiments, this waveform is a substantially smooth waveform. In some embodiments, the waveform is substantially a full-wave rectified sinusoidal shape. In some embodiments the waveform partially has the form of a rectified sine wave and partially has the form of a sine squared wave. For example, the portion of the waveform around the waveform maximum can have substantially the form of a rectified sine wave, while the portion of the waveform around the waveform minimum can have substantially the form of a sine squared wave (also herein referred to as a squared sine wave).

It is believed that the provision of the non-zero mean electrical current waveform ($I_{bat}$) to the battery 1 during charging, helps to reduce the pile-up of ions as described above. This, in turn, reduces the electrical resistance of the battery 1 during the charging cycle. This improves the efficiency of the charging of the battery 1, reduces the heat generated during the charging process and enables safer charging of the battery 1, with a higher overall charging current. In addition, the first operation of the charging cycle can be used until the battery 1 is at a greater relative level of charge (e.g. 80% or more, or 90% or more of the total charge capacity, or between 90% and 95% of the total charge capacity) than with some conventional charge cycles.

Indeed, in some embodiments, the second operation of the charge cycle may be omitted entirely.

Some embodiments may include a third operation of the charge cycle in which electrical power is occasionally (e.g. periodically) supplied to the battery 1 to compensate for self-discharge of the battery 1.

As will be appreciated, the battery charging system 100 may be implemented in a number of different manners. However, in some embodiments, additional advantages can be achieved by implementing the battery charging system 100 in accordance with particular embodiments described herein—as will become apparent.

With reference to FIGS. 4-7 embodiments of the battery charging system 100 are discussed in more detail.

Some embodiments of the battery charging system 100 may include a flyback transformer (also referred to herein as a flyback converter) 101. The flyback transformer 101 may be configured to be connected in electrical communication with a mains power supply 102. The mains power supply 102 may be an AC mains power supply delivering electrical power at the supply voltage $V_{ac}$. The battery charging system 100 may include a rectifier circuit 103 which is configured to receive electrical power from the mains power supply 102 and to rectify the electrical power from the mains power supply 102 for delivery to the flyback transformer 101.

An electromagnetic interference filter 104 of the battery charging system 100 may be connected in electrical communication between the mains power supply 102 and flyback transformer 101. In some embodiments, the electromagnetic interference filter 104 and the rectifier circuit 103 may be combined into a single circuit.

The battery charging system 100 may further include a snubber circuit 105. The snubber circuit 105 may be connected between the mains power supply 102 and the flyback transformer 101, and in particular may be connected between the electromagnetic interference filter 104 and/or the rectifier circuit 103 and the flyback transformer 101. The snubber circuit 105 may be configured to attenuate voltage spikes which might otherwise damage a primary switch device 101a of the flyback transformer 101 and/or may be configured to re-circulate current from the flyback transformer 101.

The primary switch device 101a of the flyback transformer 101 is configured to control the delivery of electrical power from the mains power supply 102 (and, for example, the rectifier circuit 103 and/or electromagnetic filter 104 and/or snubber circuit 105) to a first primary winding 101b of the flyback transformer 101.

The flyback transformer 101 further includes a first secondary winding 101c—the flow of electrical current through the first primary winding 101b being configured to induce the flow of an electrical current in the first secondary winding 101c.

The first secondary winding 101c is connected in electrical communication with an output rectifier circuit 106 which is configured to rectify the electrical power output from the flyback transformer 101 (i.e. the electrical current induced in the first secondary winding 101c).

The battery charging system 100 includes terminals 107 which are configured to be connected to the terminals 12,13 of the battery 1 (in some embodiments, the terminals 107 of the battery charging system 100 may be configured for selective connection to the terminals 12,13 of the battery 1). The terminals 107 of the battery charging system 100 are connected in electrical communication with the first secondary winding 101c. The connection is via the output rectifier circuit 106 such that the output rectifier circuit 106 is configured to rectify the electrical power output by the first secondary winding 101c for delivery to the battery 1 (which is connected to the terminals 107 of the battery charging system 100).

In some embodiments, the output rectifier circuit 106 is a synchronous rectifier circuit which includes one or more switch devices—such as a transistor device (e.g. a MOSFET).

In some embodiments, the battery charging system 100 may include a smoothing circuit 108 which is connected in electrical communication between the first secondary winding 101c and the terminals 107 of the battery charging system 100. The smoothing circuit 108 is configured to filter and/or smooth the current and/or voltage of the electrical power which is delivered to the terminals 107 (and so on to the battery 1) of the battery charging system 100.

In some embodiments, the smoothing circuit 108 may include one or more capacitors and/or inductors. In some embodiments, one or more capacitors are provided and are connected in parallel between the terminals 107 of the battery charging system 100, such that the capacitors form a bank of capacitors. In some embodiments, which may or may not include a bank of capacitors as part of the smoothing circuit 108, the smoothing circuit 108 includes at least one inductor which is connected in series between the first secondary winding 101c and one of the terminals 107 of the battery charging system 100.

The one or more capacitors of the smoothing circuit 108 may include one or more polymer electrolytic capacitors and may have a low internal resistance along with being capable of high ripple current.

The battery charging system 100 may further include, in some embodiments, an isolation switch 109 which is configured to disconnect one or both of the terminals 107 of the battery charging system 100 from electrical communication with at least the first secondary winding 101c but may also disconnect the or each terminal 107 from electrical communication with the output rectifier circuit 106 and/or the smoothing circuit 108 (or a part thereof).

The battery charging system 100 may further include a control sub-system 110. The control sub-system 110 is configured to control the operation of the battery charging system 100 including, for example, one or more of the flyback transformer 101 (e.g. the primary switch device 101a thereof), the rectifier circuit 103, the output rectifier circuit 106, and the isolation switch 109.

The control sub-system 110 may further include one or more sensor circuits and/or elements which are each configured to measure and/or determine one or more properties associated with the operation of the battery charging system 100 and/or the battery 1 such that the control sub-system 110 can control the operation of the battery charging system 100 based, at least in part, on the information received from the one or more sensor circuits and/or elements. For example, properties of the charging current can be varied in dependence on the determined properties, such as the battery impedance for example, that are determined substantially continuously during charging.

The one or more sensor circuits and/or elements may include an electrical supply voltage sensor circuit 1111 which is configured to sense an electrical voltage of the mains electrical supply 102—which may be the voltage after rectification by the rectifier circuit 103, if provided. The electrical supply voltage sensor circuit 1111 may include a potential divider circuit which is configured to reduce a voltage to a level which can be used by other parts of the control sub-system 110.

The one or more sensor circuits and/or elements may include a primary winding current sensor circuit 1112 which is configured to sense an electrical current delivered to the first primary winding 101b of the flyback transformer 101. The primary winding current sensor circuit 1112 may include a shunt circuit, for example. The primary winding current sensor circuit 1112 may be configured to sense an electrical current passing through the primary switch device 101a from the first primary winding 101b to ground or to the mains power supply 102.

The one or more sensor circuits and/or elements may include a battery terminal voltage sensor circuit 1113 which is configured to sense an electrical voltage, Vbat, across the terminals 107 of the battery charging system 100 and, hence, across the terminals 12,13 of the battery 1 connected thereto. The battery terminal voltage sensor circuit 1113 may include a potential divider circuit which is configured to reduce the voltage to a level which can be used by other parts of the control sub-system 110.

The one or more sensor circuits and/or elements may include a battery terminal current sensor circuit 1114 which is configured to sense an electrical current delivered to or returned from at least one of the terminals 107 of the battery charging system 100 and, hence, delivered to the battery 1 connected thereto. The battery terminal current sensor circuit 1114 may include a shunt circuit, for example. The battery terminal current sensor circuit 1114 may be configured to determine an electrical current passing through the output rectifier circuit 106 from a terminal 107 of the battery charging system 100 to the first secondary winding 101c of the flyback transformer 101.

The control sub-system 110 may, in some embodiments, include a primary or input side controller 1115 and a secondary or output side controller 1116. The primary side controller 1115 may be configured to communicate with the output side controller 1116, and/or vice versa, through a communication channel which may include an opto-coupler circuit 1117. The opto-coupler circuit 1117 may be configured to allow communication between the primary and secondary side controllers 1115,1116 whilst keeping the two controllers 1115,1116 electrically isolated. As will be appreciated, therefore, the opto-coupler circuit 1117 may include a light emitting diode controlled by the primary side controller 1115 and a phototransistor connected to the secondary side controller 1116.

In some embodiments, a second primary or first "bias" winding 101d is provided as part of the flyback transformer 101. The second primary winding 101d may be configured, in association with the first primary winding 101b, such that a current passing through the first primary winding 101b will also induce a current in the second primary winding 101d. The electrical power, therefore, induced in the second primary winding 101d may be used to provide electrical power to one or more of the parts of the control sub-system 110—e.g. to the primary side controller 1115. A first bias circuit 101e may be provided to ensure the correct delivery of electrical power to the primary side controller 1115. The voltage of the output from the second primary winding 101d is referred to herein as the "primary bias voltage", $V_{bias\text{-}primary}$. Besides, the second primary, or first bias winding is used to detect the magnetic state of the flyback transformer, thus assuring the critical conduction mode of operation of the flyback converter.

In some embodiments, the flyback transformer 101 may include a second secondary winding 101g or second "bias" winding. The second secondary winding 101g may be configured, in association with the first primary winding 101b, such that a current passing through the first primary winding 101b will also induce a current in the second secondary winding 101g. The electrical power, therefore, induced in the second secondary winding 101g may be used to provide electrical power to one or more of the parts of the control sub-system 110—e.g. to the secondary side controller 1116. A second bias circuit 101f may be provided to ensure the correct delivery of electrical power to the secondary side controller 1116. The voltage of the output from the second secondary winding 101g is referred to herein as the "secondary bias voltage", $V_{bias\text{-}secondary}$.

In the depicted embodiment, the first and second bias circuits 101e,f are depicted in multiple parts for simplicity of the representation. It will be appreciated, however, that they may be respective single circuits or connections.

The secondary side controller 1116 is configured to compare a signal representative of the voltage of across the terminals 107 of the battery charging system 100 (e.g. the output from the battery terminal voltage sensor circuit 1113) with a battery terminal reference voltage.

The secondary side controller 1116 may be further configured to compare a signal representative of the current delivered to or returned from at least one of the terminals 107 of the battery charging system 100 (e.g. the output from the battery terminal current sensor circuit 1114) with a battery reference current.

The secondary side controller 1116 may be configured to use the results of the voltage and/or current comparisons in order to determine a mode of operation for the battery charging system 100. This mode of operation may include determining which of the first, second, or third operation of the charging cycle to use. In some embodiments multiple charging modes and/or duty cycles are available.

In some embodiments, the secondary side controller 1116 may be configured to receive a signal indicative of the temperature of the battery 1—e.g. from a battery temperature sensor 1118 configured to sense a temperature of the battery 1 or a parameter representative of that temperature and to output a signal accordingly. The secondary side controller 1116 of these embodiments may use the signal indicative of the temperature of the battery 1 to determine which of the multiple operations of the charging cycle to use (in addition to or as an alternative to using the comparison or comparisons discussed above).

The secondary side controller 1116 is, therefore, configured to output a control signal, C. This control signal, C, may be communicated to the primary side controller 1115 (e.g. via the opto-coupler circuit 1117) and the primary side controller 1115 may use this control signal, C, to control the operation of the flyback transformer 101—as described herein.

The secondary side controller 1116 may be further configured to operate the isolation switch 109 if one or more predetermined conditions occur and these may include one or more of a particular current delivered to or received from the battery 1 exceeding or falling below a predetermined threshold current, and/or a voltage across the terminals 12,13 of the battery 1 exceeding or falling below a predetermined threshold voltage, and/or the battery temperature falling below or exceeding a predetermined threshold temperature.

The secondary side controller 1116 may be configured to control the operation of the output rectifier circuit 106 (which may be a synchronous rectifier circuit) based on the output of a signal indicative of the electrical current delivered to the terminals 107 of the battery charging system 100 (i.e. to the battery 1 connected thereto) and/or based on a signal indicative of the current passing through the output rectifier circuit 106. This signal may, as will be appreciated, be the output from the battery terminal current sensor circuit 1114. In some embodiments, the secondary side controller 1116 is configured to actuate the output rectifier circuit 106 to an on-state when the flyback transformer 101 is discharging to the terminals 107 of the battery charging system 100 and to disable the output rectifier circuit 106 to an off-state when the flyback transformer 101 is not discharging to the terminals 107.

The primary side controller 1115 is configured to control the operation of the flyback transformer 101 and, in particular, to control the actuation of the primary switch device 101*a*. The primary side controller 1115 is configured to control the operation of the flyback transformer 101 based at least in part on one or more of the control signal, C, a signal representative of the electrical current delivered to the first primary winding 101*b* (e.g. the output of the primary winding current sensor circuit 1112), a signal representative of the electrical voltage ($V_{ac}$) of the mains power supply 102 after rectification by the rectifier circuit 103 (e.g. the output of the electrical supply voltage sensor circuit 1111), and the AC bias voltage, $V_{bias}$ before the bias rectification circuit.

The primary side controller 1115 is configured to operate the flyback transformer 101 in a critical conduction mode of operation.

Accordingly, the primary side controller 1115 may be configured to actuate the primary switch device 101*a* to an on-state (such that electrical power may pass from the mains power supply 102 to the first primary winding 101*b*) once it has been determined that the energy stored in the flyback transformer 101 (e.g. in the windings 101*b*,101*c*,101*d*, and any core thereof) has been dissipated—i.e. delivered to the terminals 107 of the battery charging system 100 and to the battery 1 (or otherwise lost).

With the primary switch device 101*a* in its on-state, electrical power is delivered to the first primary winding 101*b* such that there is a build-up of energy stored in the flyback transformer 101 which, in turn, is delivered via the first secondary winding 101*c* as electrical power to the terminals 107 of the battery charging system 100 and to any battery 1 connected thereto.

The primary side controller 1115 may be further configured to actuate the primary switch device 101*a* to an off-state (such that electrical power is substantially prevented or hindered from passing from the mains power supply 102 to the first primary winding 101*b*) when the signal representative of the electrical current delivered to the first primary winding 101*b* has reached a value which is dependent on the signal representative of the electrical voltage of the mains power supply 102, and the control signal, C.

The primary side controller 1115 may be configured, therefore, to actuate the primary switch device 101*a* to have a switching frequency (i.e. a frequency of switching between is on- and off-states) which varies over time.

Figure 8:
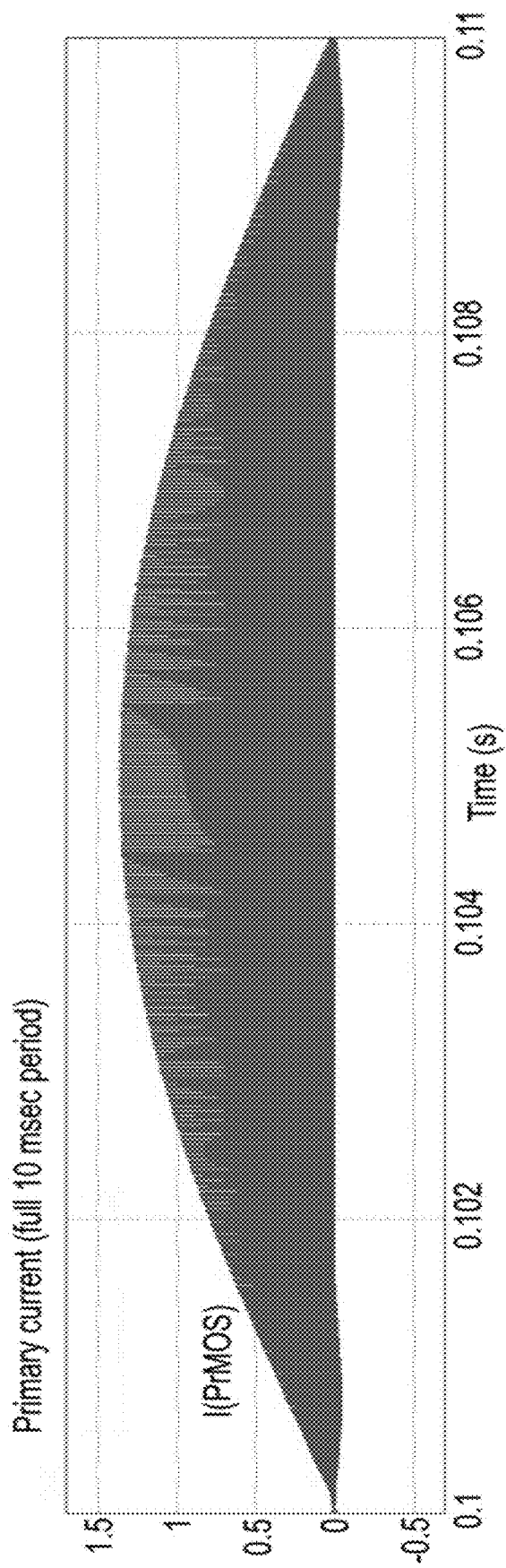
FIGS. 8-10 show the current through a first primary winding of a flyback transformer during a charging cycle according to some embodiments.
Figure 9:
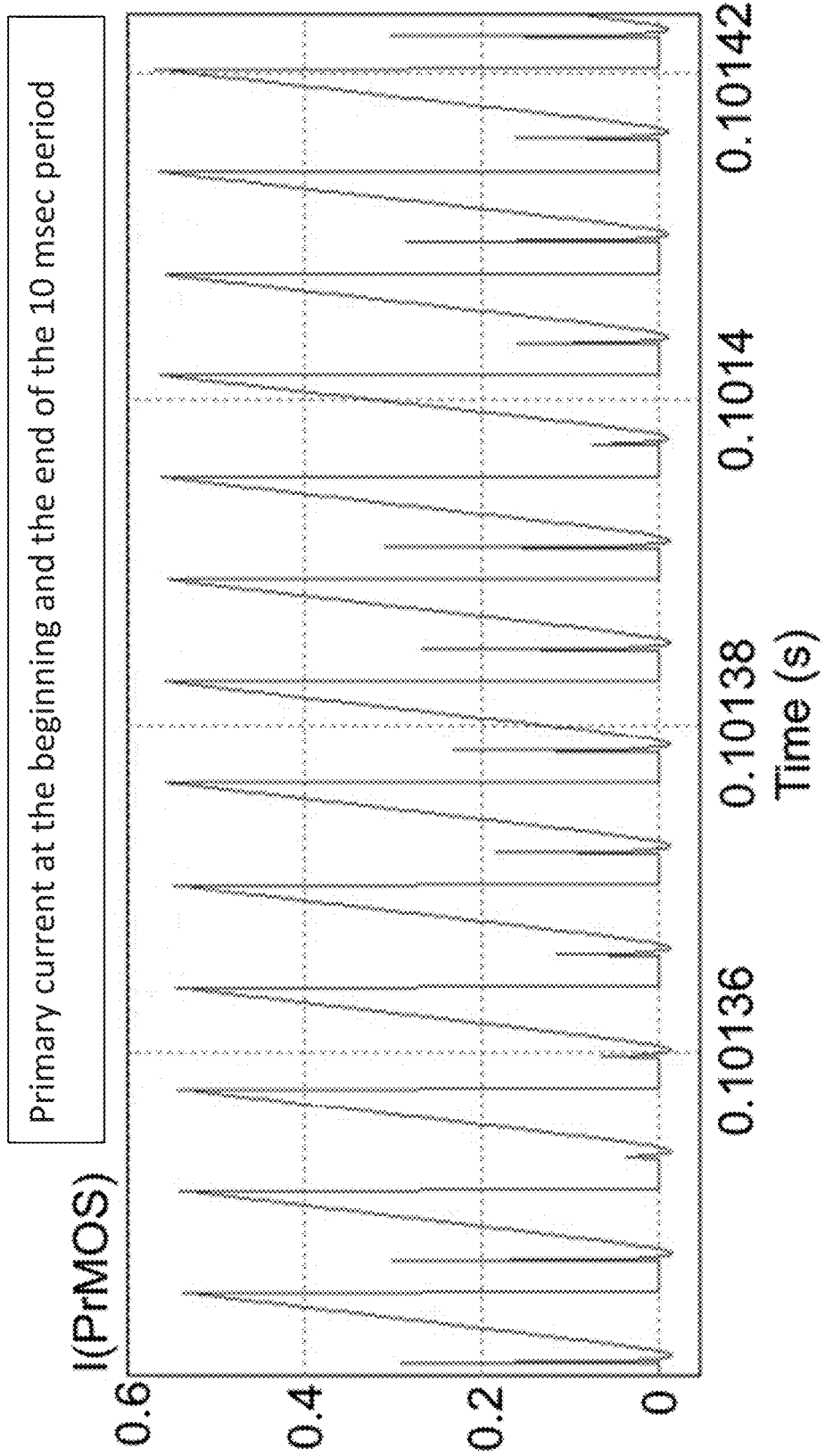
Figure 10:
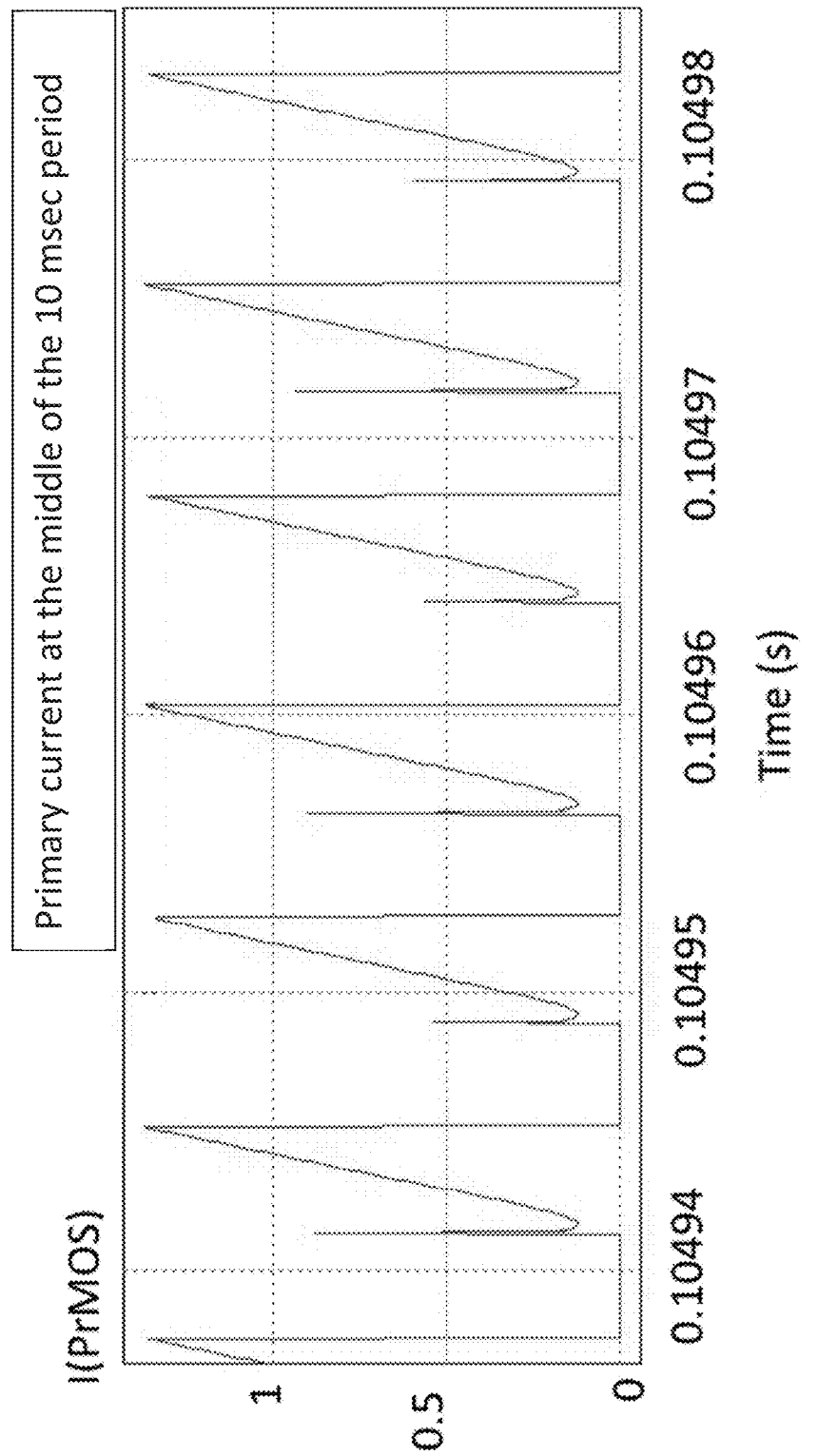

The primary side controller 1115 may actuate the primary switch device 101*a* such that the electrical current flowing through the first primary winding 101*b* has an envelope which may generally follow the voltage of the mains power supply 102 (or the rectified mains power supply voltage). Within the envelope, the current flowing through the first primary winding 101*b* may be pulsed with a varying frequency and/or duty cycle (the frequency and/or duty cycle determining the magnitude of the current) and the frequency and/or duty cycle being controlled by the actuation of the primary switch device 101*a*. FIG. 8 shows a graphical representation of the current delivered to the first primary winding 101*b* and shows the envelope of this current. FIGS. 9 and 10 show the pulses of current which form part of that envelope at different times.

Accordingly, during an initial period, the frequency of actuation of the primary switch device 101*a* (and hence the current in the first primary winding 101*b*) may be relatively high (see FIG. 9, for example) (and/or the duty cycle may be relatively low), with the frequency of the actuation decreasing (and/or the duty cycle increasing) as the magnitude of the envelope of the current increases (see FIG. 10, for example), before the frequency of actuation increases again (and/or the duty cycle decreases) as the magnitude of the envelope of the current decreases (see FIG. 9 again, for example). Accordingly, the frequency and/or duty cycle of actuation of the primary switch device varies over time and the frequency and/or duty cycle at any given time is dependent on the magnitude of the voltage of the electrical supply, $V_{ac}$, at that time.

This operation of the primary side controller 1115 and primary switch device 101*a* helps to ensure an improved power factor (which may be 0.9 or above).

Figure 7:
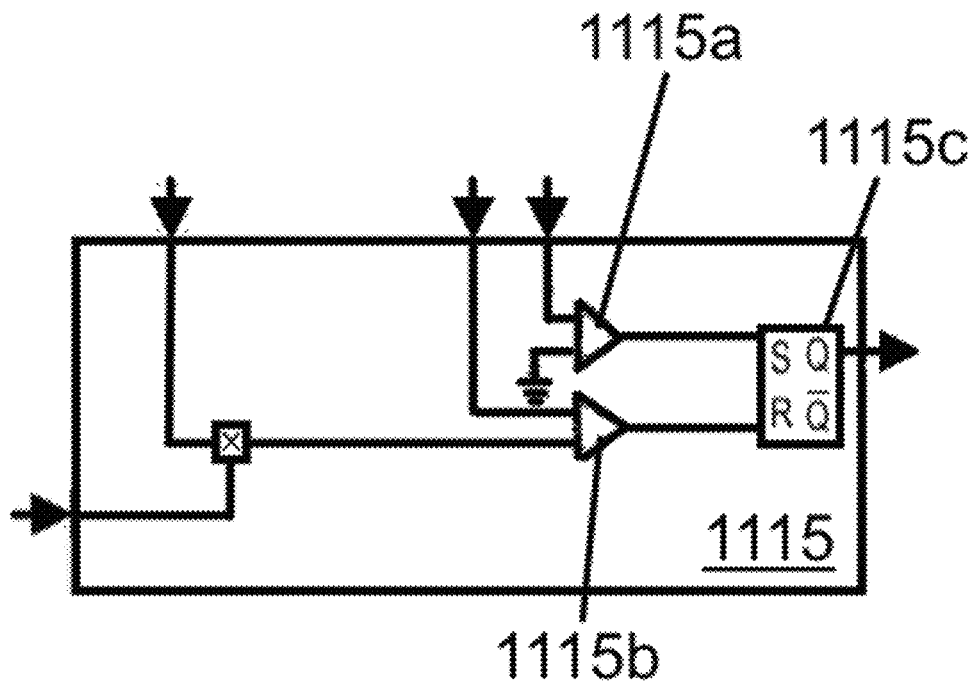

In some embodiments, the primary side controller 1115 may be implemented using a circuit such as depicted in FIG. 7. In this embodiment, the primary side controller 1115 includes a variable gain amplifier 1115a which is configured to receive the signal representative of the electrical voltage of the mains power supply 102 and to attenuate or amplify that signal using the control signal, C. The output from this variable gain amplifier 1115a is passed to a first comparator 1115b of the primary side controller 1115 (e.g. to a non-inverting input thereof). The signal representative of the electrical current delivered to the first primary winding 101b may be passed to an inverting input of the first comparator 1115b. The output of the first comparator 1115b may be connected to a reset input of a set-reset flip-flop 1115c of the primary side controller 1115. The bias voltage (or a signal representative of the bias voltage) may be connected to an inverting input of a second comparator 1115d of the primary side controller 1115. A non-inverting input of the second comparator 1115d may be connected to ground. An output of the second comparator 1115d may be connected to a set input of the set-reset flip-flop 1115c, and an output of the set-reset flip-flop 1115c may be connected to the primary switch device 101a to control its actuation.

In some embodiments, the primary switch device 101a is a transistor device such as a Power MOSFET and, in such embodiments, the output of the set-reset-flip-flop 1115c may be connected to a gate of the MOSFET forming the primary switch device 101a.

In some embodiments, the flyback transformer 101 is of a gapped ferrite core flyback type which may have four interleaved windings—to reduce leakage inductance. The flyback transformer 101 may, for example, be a high frequency transformer 101 configured to operate at up to 150 W per core.

The bias circuit first 101e may include one or more fast rectifier diodes in order to provide electrical power to the primary controller sub-system 110.

The frequency of operation of the flyback transformer 101—e.g. the switching frequency of the primary switch device 101a—may be varied between about 40 KHz and 200 KHz.

As will be appreciated, many conventional battery charging systems 100 use a Schottky rectifier diode in the output rectifier circuit 106. In some embodiments, of the present invention, however, the use of a synchronous rectifier removes the need for this Schottky rectifier diode—which can reduce cost, improve efficiency, eliminate the need of a heatsink and reduce the physical space required for the circuit.

The controller sub-system 110 may be configured such that the electric current delivered to the terminals 107 of the average battery charging system 100 (and so to the battery 1) is around 16 A. The controller sub-system 110 may be configured such that the electric current delivered to the terminals 107 of the battery charging system 100 (and so to the battery 1) varies between 0 A and 30 A.

The controller sub-system 110 may be configured such that the isolation switch 109 is actuated to its off-state when the signal indicative of the voltage across the terminals 107 of the battery charging system 100 reaches or exceeds about 4V and/or when the battery 1 is disconnected from the terminals 107.

In some embodiments, the secondary side controller 1116 acts as a master controller which is configured to control the operation of the primary side controller 1115—which may, therefore, be referred to as a slave controller. The secondary side controller 1116 may, in such embodiments, be configured to communicate with one or more systems outside of the battery charging system 100 to control one or more aspects of the battery charging system's 100 operation.

The secondary side controller 1116 (and primary controller 1116) can be configured to vary properties of the charging current in dependence on determined properties of the battery during charging. Examples of determined properties of the battery and properties of the charging current are given below.

In some embodiments, the control sub-system 110 is configured to monitor the electrical impedance of the battery 1. The delivery of the charging current to the battery 1 by the charging system 100 to charge the battery 1 may then be based, at least in part, on the electrical impedance of the battery 1. Properties of the charging current can therefore be dependent on the determined electrical impedance of the battery 1.

As discussed above, in some embodiments, the secondary side controller 1116 may be configured to determine a mode of operation for the battery charging system 100. Accordingly, it may be the secondary side controller 1116 which is configured to monitor the electrical impedance of the battery 1 and to use this information to control an aspect of the delivery of electrical current to the battery 1 by the charging system 100.

More specifically, in some embodiments, the secondary side controller 1116 is configured to receive a signal representative of the current delivered to or returned from at least one of the terminals 107 of the battery charging system 100 (e.g. the output from the battery terminal current sensor circuit 1114), $I_{bat}$. Alternatively or additionally, the secondary side controller 1116 is configured to receive a signal representative of the change in current delivered to or returned from at least one of the terminals 107 of the battery charging system 100 during a portion of the charging current waveform delivery. An example of such a change in current may be the difference between the peak (maximum) and trough (minimum) charging current. In embodiments where the minimum current is zero amps, this difference is equal to the maximum current measured.

Figure 11A:
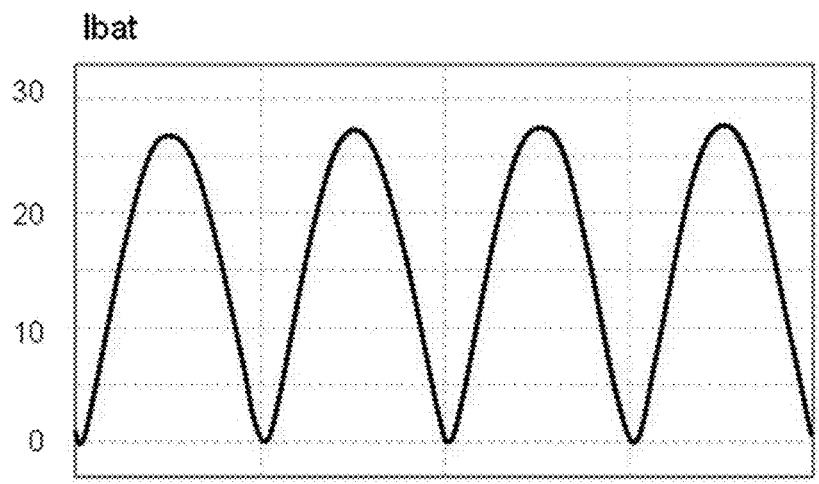
FIGS. 11a-11c show graphical representations of the electrical current delivered to a battery, the electrical voltage across the battery terminals, and an extracted ripple voltage signal.
Figure 11B:
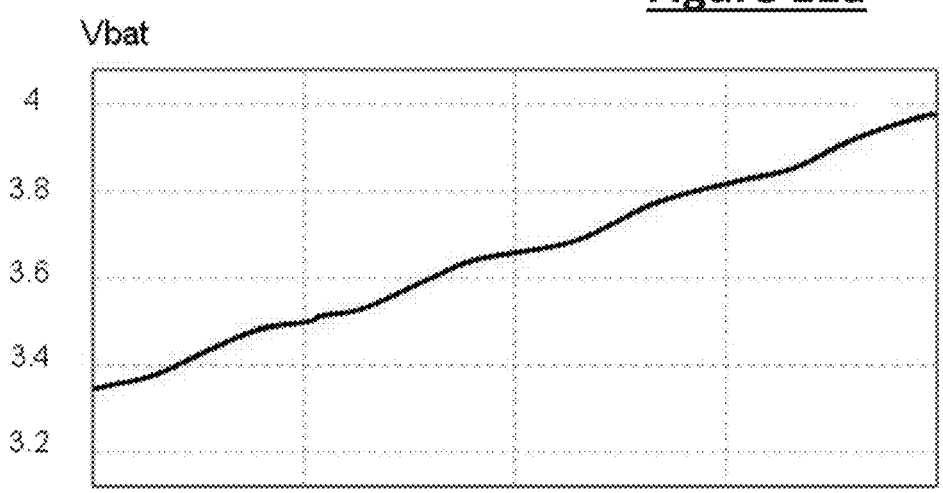

The delivery of electrical current, $I_{bat}$, to the battery 1 connected to the terminals 107 according to the current waveforms described herein causes the voltage across the terminals 12,13 of the battery 1 to ripple as a result of the battery's electrical impedance, $Z_{bat}$. This can be seen in FIGS. 11a and 11b, in which FIG. 11a shows $I_{bat}$ and FIG. 11b shows the voltage, $V_{bat}$, across the terminals 12,13 of the battery 1 in an example use of some embodiments of the invention.

The secondary side controller 1116 may be configured, therefore, to use the signal representative of the voltage of across the terminals 107 of the battery charging system 100 (e.g. the output from the battery terminal voltage sensor circuit 1113) to determine the electrical impedance of the battery 1, $Z_{bat}$, connected to those terminals 107 (by its terminals 12,13).

More specifically, the secondary side controller 1116 may be configured to receive the signal representative of the voltage across the terminals 107 of the battery charging system 100 over a first period of time. The secondary side controller 1116 may be configured to determine a DC component of that signal (and hence the voltage it represents). This may be achieved by, for example, determining a mean average of that signal over the first period and taking this to be the DC component. This DC component is then subtracted from the signal to generate a voltage ripple signal representative of the ripple voltage of across the terminals 107 of the battery charging system 100 (and hence across the terminals 12,13 of the connected battery 1), $\Delta V_{bat}$. This signal may be amplified and/or filtered in order to improve the signal's representation of the ripple voltage. For example, the frequency of the ripple voltage is expected to be substantially identical to that of the current delivered to or returned from at least one of the terminals 107; therefore, one or more filters may be used to attenuate frequency components of the ripple voltage signal which are above and/or below this frequency. An example of the voltage ripple signal can be seen in in FIG. 11c, for example.

The secondary side controller 1116 may be configured to divide the signal representative of the ripple voltage, $\Delta V_{bat}$, by a signal representative of a change in current delivered to or returned from at least one of the terminals 107 of the battery charging system 100, $\Delta I_{bat}$, in order to arrive at the electrical impedance of the battery 1 connected to those terminals 107.

In some embodiments, the current delivered to or returned from at least one of the terminals 107 of the battery charging system 100, $I_{bat}$, may vary from 0 A to a peak (maximum) current (before returning to 0 A following the waveforms described herein). Therefore, the signal representative of $I_{bat}$ may be substantially equal to the signal representative of $\Delta I_{bat}$ and may be used as such. However, in some embodiments, $I_{bat}$ varies between a non-zero lower value and a peak current. Therefore, in some embodiments, $\Delta I_{bat}$ is not equal to $I_{bat}$. In such embodiments, the secondary side controller 1116 may be configured to determine $\Delta I_{bat}$ from the signal representative of the current delivered to or received from the terminals 107, $I_{bat}$.

Figure 11C:
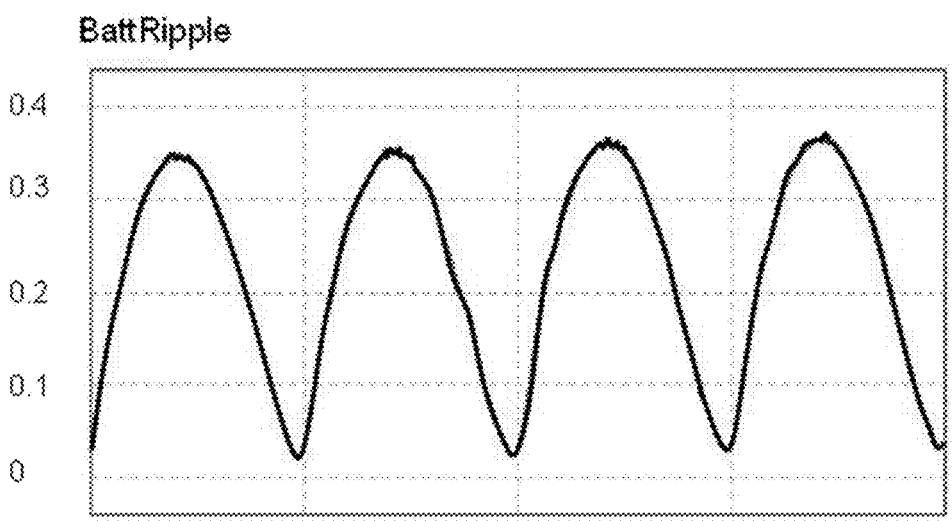

FIGS. 11a and b illustrate the current and the voltage at the battery terminals as charging progresses. As the battery is undergoing charging, the baseline voltage steadily increases with an overlaid ripple caused by the oscillating input current. In order to determine the impedance of the battery at a given point in time, only the ripple in the voltage is relevant, and is evaluated separately from the increasing voltage baseline. FIG. 11c shows an illustration of the voltage ripple. In order to determine the magnitude of the ripple, for example a linear baseline voltage is fitted to the voltage curve and the deviation from that baseline is evaluated. That deviation gives the flattened ripple. The flattened ripple can then be evaluated to determine the effect of the impedance on the voltage. The magnitude of the ripple voltage divided by the magnitude of the battery current gives the magnitude of the impedance. In another example a mean average of the voltage signal in a period is determined and subtracted from the voltage signal; this again gives the ripple as distinct from the baseline voltage. In the case of non-oscillating steady charging the battery voltage increases steadily, and no signal is available that is indicative of the impedance of the battery.

The internal impedance of the battery and the battery internal battery voltage are not generally accessible for direct measurement while the battery is being charged. By dividing the change in current by the change in voltage the battery internal impedance of the battery can be determined without the need to know the internal battery voltage.

The secondary side controller 1116 may be configured to determine the electrical impedance of the battery 1 using the above process periodically. In some embodiments, the secondary side controller 1116 is configured to determine the electrical impedance of the battery 1 at a frequency which is substantially equal to the frequency of the signal representative of the current delivered to or received from the terminals 107 of the battery charging system 100. In other words, the secondary side controller 1116 may be configured to determine the electrical impedance of the battery 1 once for every peak in the signal representative of the current delivered to or received from the terminals 107 of the battery charging system 100, thereby effectively determining the electrical impedance of the battery 1 substantially continuously.

In some embodiments, the secondary side controller 1116 may be configured to determine the electrical impedance of the battery 1 at a frequency which is substantially equal to at least the frequency of the signal representative of the current delivered to or received from the terminals 107 of the battery charging system 100, thereby effectively determining the electrical impedance of the battery 1 substantially continuously. In such embodiments, the secondary side controller 1116 may be configured to determine the impedance of the battery 1 using the rising or the falling peak-to-peak variation in the signal representative of $I_{bat}$.

In some embodiments, the secondary side controller 1116 is configured to determine the impedance of the battery 1 at a frequency or between about 100 Hz and 120 Hz, or at a frequency of about 120 Hz, or between 100 Hz and 200 Hz, or at a frequency of about 200 Hz, or between 120 Hz and 240 Hz, or at about 240 Hz, or at any combination of the upper and lower bounds of these ranges.

As will be appreciated, in some embodiments, whilst the determining of the impedance of the battery 1 is periodic in absolute terms, the determining is substantially continuous relative to the frequency at which the secondary side controller 1115 may be configured to cause changes in $I_{bat}$ during a charging cycle—see below. It will be appreciated that this will still effectively be the case if the impedance of the battery is not determined at exactly the frequency of the charging current waveform, but is instead determined at a frequency that is substantially continuous relative to the frequency at which the secondary side controller 1115 may be configured to cause changes in $I_{bat}$ during a charging cycle.

The change in current and change in voltage supplied to the battery 1 can be measured during the rising current portion of the current waveform. The minimum of the current waveform can provide a convenient starting point to measure these properties from. The changes can alternatively or additionally be measured on the falling current portion of the current waveform. When these properties are measured on both the rising and falling portion of the waveform, the results can be compared by the secondary side controller 1115 in order to determine if there is an error.

The control sub-system 110 may include a look-up table 1119. This look-up table 1119 may be stored on a computer readable medium 1119a of the control sub-system 110 or to which the control sub-system 110 has access. The look-up table 1119 may, in some embodiments, be part of or accessible by the secondary side controller 1116.

The look-up table 1119 may store information which correlates battery condition and/or charge state to charging mode. Accordingly, the look-up table 1119 may be used by the control sub-system 110 (e.g. the secondary side controller 1116) to determine an appropriate charging mode for the battery 1 based on determined properties about the battery 1 which is available to the control sub-system 110.

These determined properties available to the control sub-system 110 (e.g. to the secondary side controller 1116) may include one or more of: $I_{bat}$, $V_{bat}$, $\Delta I_{bat}$, $\Delta V_{bat}$, and $Z_{bat}$. This information may also include the temperature of the battery $T_{bat}$ 1. In embodiments where the battery comprises multiple cells, these properties for each cell may be available to the control subsystem in addition to or alternatively to the complete battery properties.

In some embodiments, the information available to the control sub-system 110 (e.g. the secondary side controller 1116) may include an identity of the battery 1—which may be determined, for example, by a battery identifier which is communicated to the control sub-system 110. The battery identifier may be an identifier which is unique or substantially unique to that battery 1 (such as a serial number) or may be more a more general identifier which is unique or substantially unique to that manufacturer of battery 1 or that model of battery 1 or that configuration of battery 1, for example. The identity may be communicated to the control sub-system 110 (e.g. the secondary side controller 116) by one or more signals transmitted from the battery 1 to the control sub-system 110 (e.g. via a communication link between the two) or may be manually entered by a user.

The control subsystem 110 may further comprises a time measurement means, such as a clock. This can be used to measure the time the battery 1 has been charging. By integrating the time the battery 1 has been charging with respect to the charging current, the total charge delivered to the battery can be determined. This integration can, for example, be performed numerically. The total charge can be used to determine the State of Charge of the battery 1.

The control sub-system 110 (e.g. the secondary side controller 1116) may use the determined properties available to it (see above) to determine the current charge state and/or health of the battery 1. As will be appreciated, the health of a battery 1 is a measure of the correct operation of the battery 1 (such as its ability to hold charge). The current charge state of the battery 1 may be otherwise referred to as the current condition of the battery 1 or the battery state of charge (S.O.C.). These can be used to determine if and how the charging current supplied to the battery 1 should be varied.

In some embodiments, the battery impedance is not determined, and instead the change in current $\Delta I_{bat}$ and change in voltage $\Delta V_{bat}$ can be used directly to determine the current charge state and/or health of the battery, and therefore determine if and how the charging current should be varied.

In some embodiments, the look-up table 1119 provides a duty cycle and/or frequency for the operation of the primary switch device 101a based on the determined properties available to the control sub-system 110 (e.g. to the secondary side controller 1116)—see above. In some embodiments, the look-up table 1119 is used to provide an indication of a desired $I_{bat}$ for the condition and/or health of the battery 1. The look-up table 1119 may, for example, provide C (see above). Other properties of the battery charging current, such as: a current mean value; a current maximum value; a current amplitude; a duty cycle; and/or a charging mode may also be provided in the look up table.

For example, a fully discharged battery 1 will have a relatively high electrical impedance and so the look-up table 1119 may specify a relatively low $I_{bat}$ in order to avoid the risk of overheating the battery 1 and/or otherwise damaging the battery 1. Likewise, if there is a low determined impedance, then the look-up table 1119 may specify a relatively high $I_{bat}$.

The above description of the operation of the control sub-system 110 refers to the monitoring of the electrical impedance of a battery 1. As is mentioned above, this is to be construed as monitoring the electrical impedance of one or more cells 11 of that battery 1.

In some embodiments, a battery 1 includes a plurality of cells 11. In such embodiments, the impedance of each cell 11 may be determined—the above operations being performed on each cell 11 in the battery 1—and the charging mode may be determined based on the information determined for more than one cell 11 of the battery 1.

Embodiments of the present invention have been described with reference to a flyback converter 101, but it will be appreciated that these and other embodiments may be implemented by using a converter with a different topology. Such a converter may be capable of high frequency operation (e.g. operation in the range of 40 to 200 kHz).

A single battery charging system 100 has been described herein. However, it will be understood, that a plurality of such battery charging systems 100 may be provided connected in parallel with each other and configured to supply an electrical current ($I_{bat}$) to the same terminals 107. In such an arrangement, all of the battery charging systems 100 may be controlled by a common control sub-system 110. In some embodiments, such arrangements may include a primary side controller 1115 for each battery charging system 100 but a single secondary side controller 1116 which is configured to control the operation of all of the primary side controllers 1115.

As will be appreciated, embodiments supply the electrical current $I_{bat}$ having a waveform which allows the electrical impedance of the battery 1 to be determined frequently without the need for any additional manipulation of $I_{bat}$ for the purpose of determining the battery's electrical impedance. In other words, the electrical current which is used to charge the battery and which forms the main current to charge the battery 1 (i.e. a charging current) may be used to determine the battery's electrical impedance. This is different, for example, from a relatively, small magnitude, current which is deliberately added to a constant or substantially constant main charging current in order to determine the battery's electrical impedance. In such a hypothetical arrangement, the maximum frequency at which the electrical impedance of the battery 1 can be determined is much lower than in some embodiments of the present invention. In addition, the small magnitude of the current does not contribute substantively to the charging of the battery 1 (e.g. being only of the hundreds of milliamp-level). Such a low magnitude current does not, therefore, form part of a main charging current—unlike the current, $I_{bat}$, in some embodiments of the present invention in which the changes in the current are of a magnitude that does impact the charging of the battery 1 and, therefore, forms part of the main charging current.

In some embodiments, the control sub-system 110 is configured to communicate with a remote server 210. The communication may be via a communication network—such as a local area network and/or a wide area network and may include the Internet. The remote server 210 may, for example, store the look-up table 1119 or part thereof. In some embodiments, the remote server 210 includes the computer readable medium 1119a. In some embodiments, the control sub-system 110 is configured to download at least part of the look-up table 1119 (e.g. to a local computer readable medium) 1119a. The control sub-system 110 (e.g. the secondary side controller 1116) may be configured to request the whole or part of the look-up table 1119 from the remote server 210 and may be able to upload information about a battery 1 to the remote server 210.

The remote server 210 may be configured to maintain the look-up table 1119 and this may include receiving information about a battery 1 or a type of battery 1 from the control sub-system 110 and then updating the look-up table 1119 based on that information. This may include updating the look-up table in relation to that particular battery 1 and/or for that type of battery 1 (e.g. based on the configuration of the battery 1, the make and/or model of that battery 1). The remote server 210 may be configured to collate the information received about a plurality of batteries 1 in order to modify the look-up table 1119 or parts thereof to optimise one or more aspects of the operation of the battery charging system 100 using the look-up table 1119—this may include ensuring the maximum amount of charge is stored in a battery 1, ensuring the maximum lifespan (i.e. number of charging cycles) of a battery 1, and/or ensuring the most efficient use of electrical power by the battery charging system 100.

Figure 12:
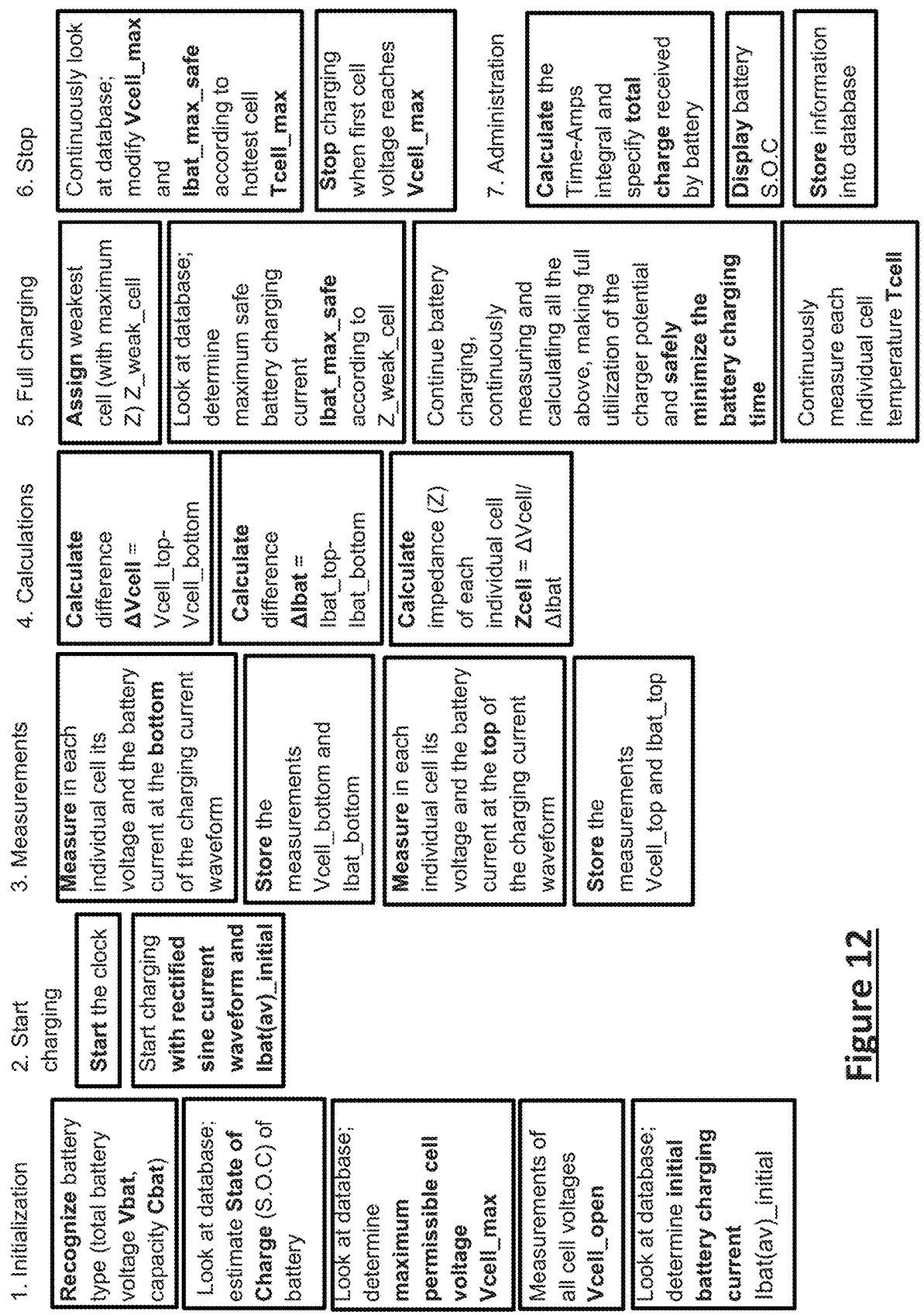
FIG. 12 shows a step-by-step procedure for charging a battery.

FIG. 12 illustrates a step-by-step procedure for charging a battery. The procedure is intended to provide high power efficiency and safely minimize the battery charging time.

1. Initialization

Recognize the type of battery (Total Battery Voltage Vbat and Capacity Cbat)

Look at the data base and estimate the State of Charge (S.O.C.) of the battery

Look at the data base and determine the maximum permissible cell voltage Vcell_max Measurements of all the Cells Voltages Vcell_open Look at the data base and determine the initial battery charging current Ibat(av)_initial 2. Start Charging Start the clock Start charging with rectified sine current waveform and Ibat(av)_initial 3. Measurements Measure in each individual cell its voltage and the battery current at the bottom of the charging current waveform Store the measurements Vcell_bottom and Ibat_bottom Measure in each individual cell its voltage and the battery current at the top of the charging current waveform Store the measurements Vcell_top and Ibat_top 4. Calculations Calculate the difference ΔVcell=Vcelltop−Vcellbottom Calculate the difference ΔIbat=Ibat_top−Ibat_bottom Calculate the impedance of each individual cell Zcell=ΔVcell/ΔIbat 5. Full Charging Assign the weakest cell (with the maximum impedance) Z_weak_cell Look at the data base and determine the maximum safe battery charging current Ibat_max_safe, according to the Z_weak_cell Continue battery charging, continuously measuring and calculating all the above, making full utilization of the charger potential and safely minimize the battery charging time Continuously measure each individual cell temperature Tcell.

6. Stop

Continuously look at the data base and modify the Vcell_max and Ibat_max_safe according to the hottest cell Tcell_max Stop the charging when the first cell voltage reaches Vcell_max 7. Administration Calculate the Time-Amps integral and specify the total charge received by the battery.

Display the Battery S.O.C.

Store information into the database

Storing the determined properties of the battery in the database, which can for example reside in a look-up table stored in a controller/control unit memory, can allow the battery charging system to correlate these properties for future use in charging other batteries and/or charging the same battery again.

The determined properties can, for example, be stored along with identification data, associating the properties with that particular battery. When charging that particular battery in the future, these properties can be used to determine the battery state and/or the required charging current properties.

Alternatively or additionally, the stored determined properties can be aggregated into a dataset from which battery property correlations can be determined for classes and/or types of battery. These correlations can be used when charging batteries of the same type and/or class to determine/estimate the battery state and/or the required charging current properties.

By storing the determined properties and using them to assist in future battery charging events, the system can be said to be self-learning.

Figure 13:
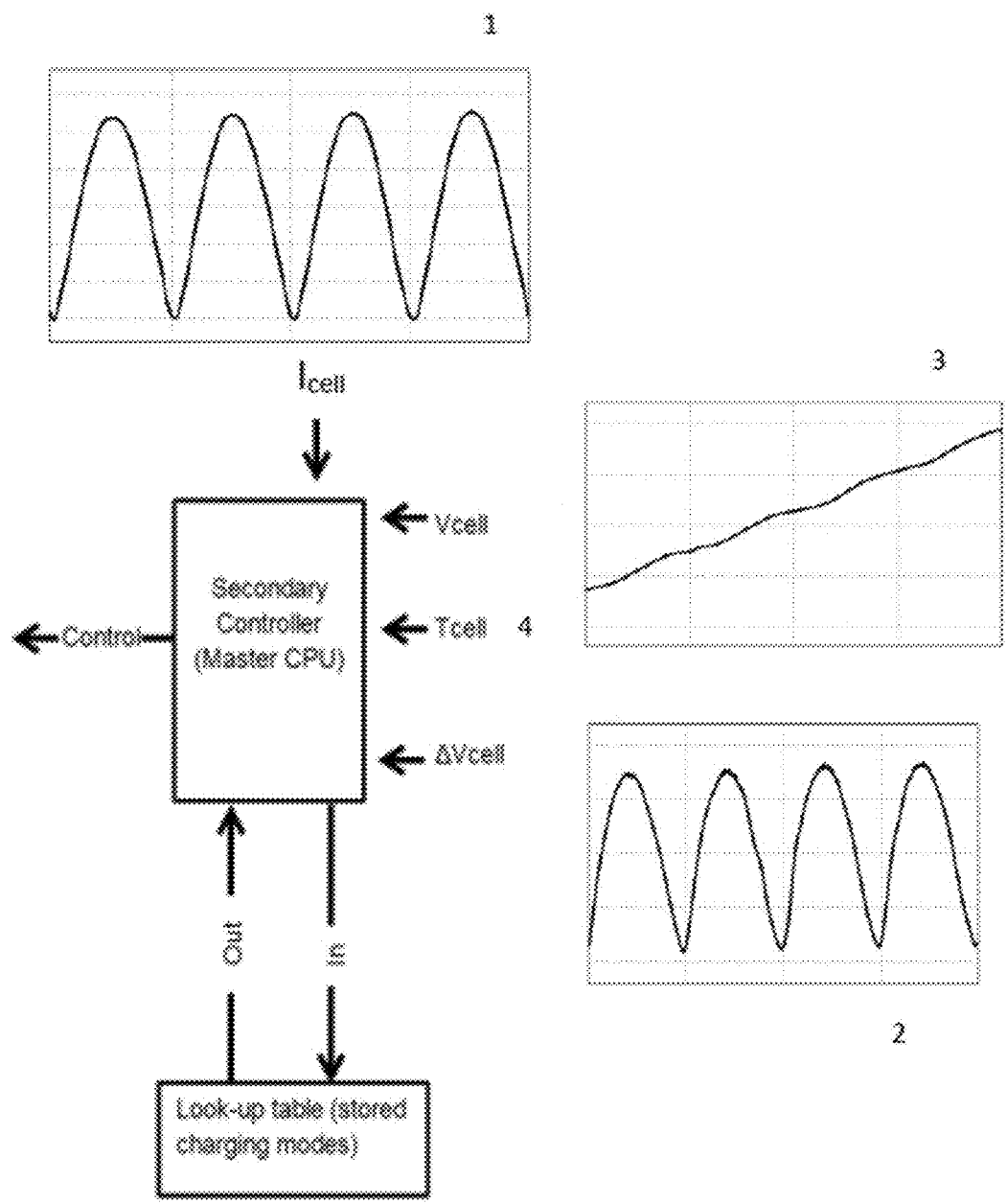
FIG. 13 shows a schematic example of a single cell battery control unit in use.

FIG. 13 illustrates a schematic example of a single cell battery control unit in use. The secondary controller (Master CPU) drives a current source, such as a flyback converter, to charge a battery cell with a charging current ($I_{cell}$), for example a current with an oscillating DC waveform such as a rectified sinusoidal waveform, of about twice the line frequency. This direct (i.e. always positive) but time varying current can have a minimum value of less than about 0.5 amps, preferably less than about 0.1 amps, more preferably about 0 amps, with a maximum value of about 30 amps.

This "ripple" battery charging current creates a ripple battery cell voltage $\Delta V_{cell}$ due to the battery internal impedance $Z_{cell}$. The battery internal impedance $Z_{cell}$ can depend on the battery cell state of charge, battery cell temperature $T_{cell}$ battery cell voltage $V_{cell}$ and battery cell history, for example.

The rippled battery voltage $\Delta V_{cell}$ can be filtered and amplified, and used to transfer battery condition information to the secondary controller. This can be used together with $I_{cell}$ (and/or the change in current $\Delta I_{cell}$ if the minimum of the charging current is not zero) to calculate $Z_{cell}$. The controller uses this information, along with the other determined properties such as the battery cell temperature $T_{cell}$ and battery cell voltage $V_{cell}$ to choose an appropriate charging mode from a look up table. The secondary controller can then vary properties of the charging current in dependence on the battery cell situation by, for example, changing the duty cycle of the primary controller.

For example, when the battery is fully discharged, the battery internal impedance can increase. The secondary controller calculates the battery impedance using the rippled charging current and the voltage ripple that this current induces. The secondary controller then determines the required charging mode from the look up table. In order to avoid overheating and/or damage of the battery cell, the look up table indicates that a different charging mode is required. The secondary controller sends another charging mode to the primary controller with a reduced duty cycle, thereby reducing the battery charging current.

Effectively, the battery cell itself "decides" at every moment which is the best mode for charging.

Figure 14:
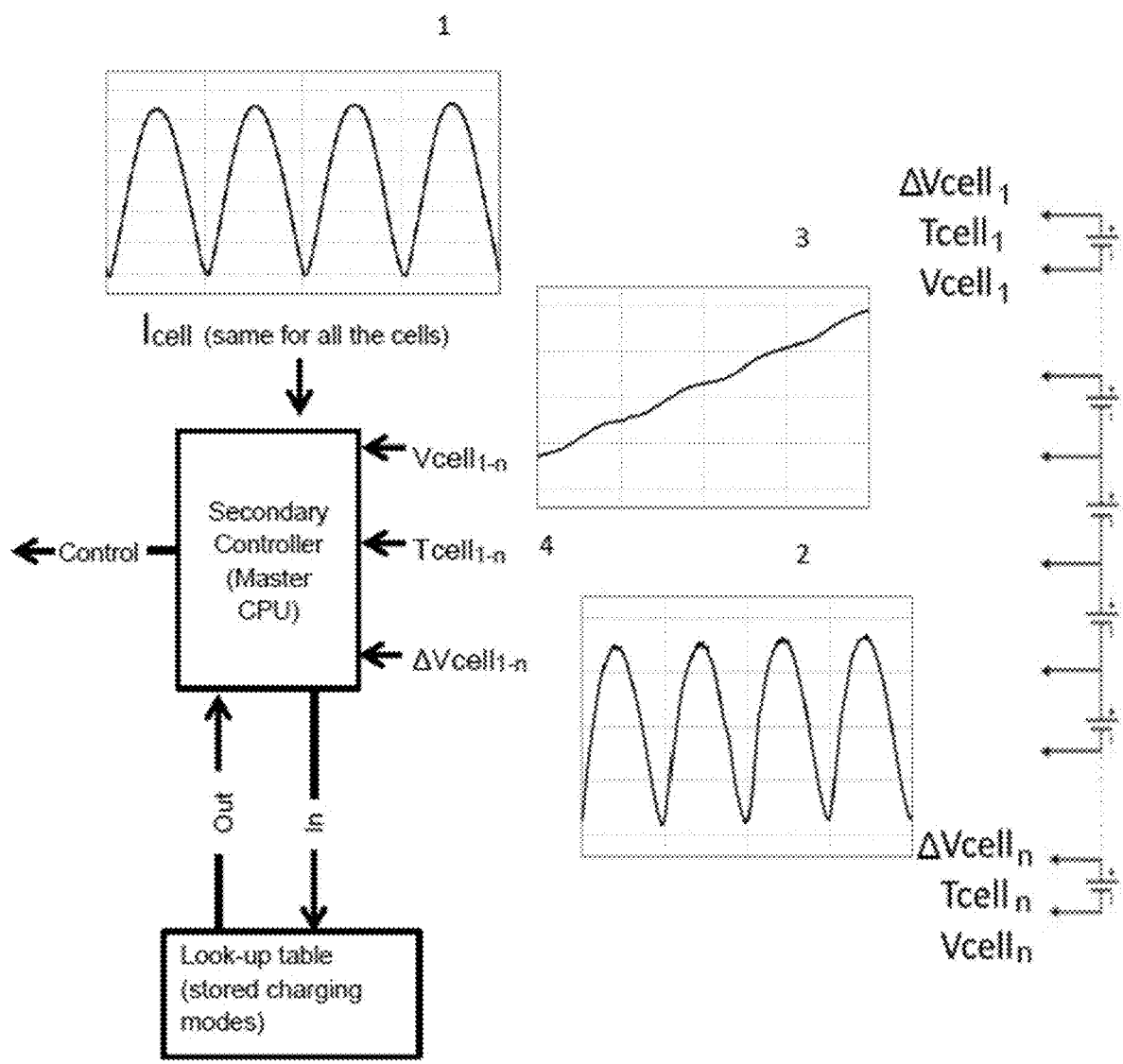
FIG. 14 shows a schematic example of a multi-cell battery control unit in use.
Figure 15:
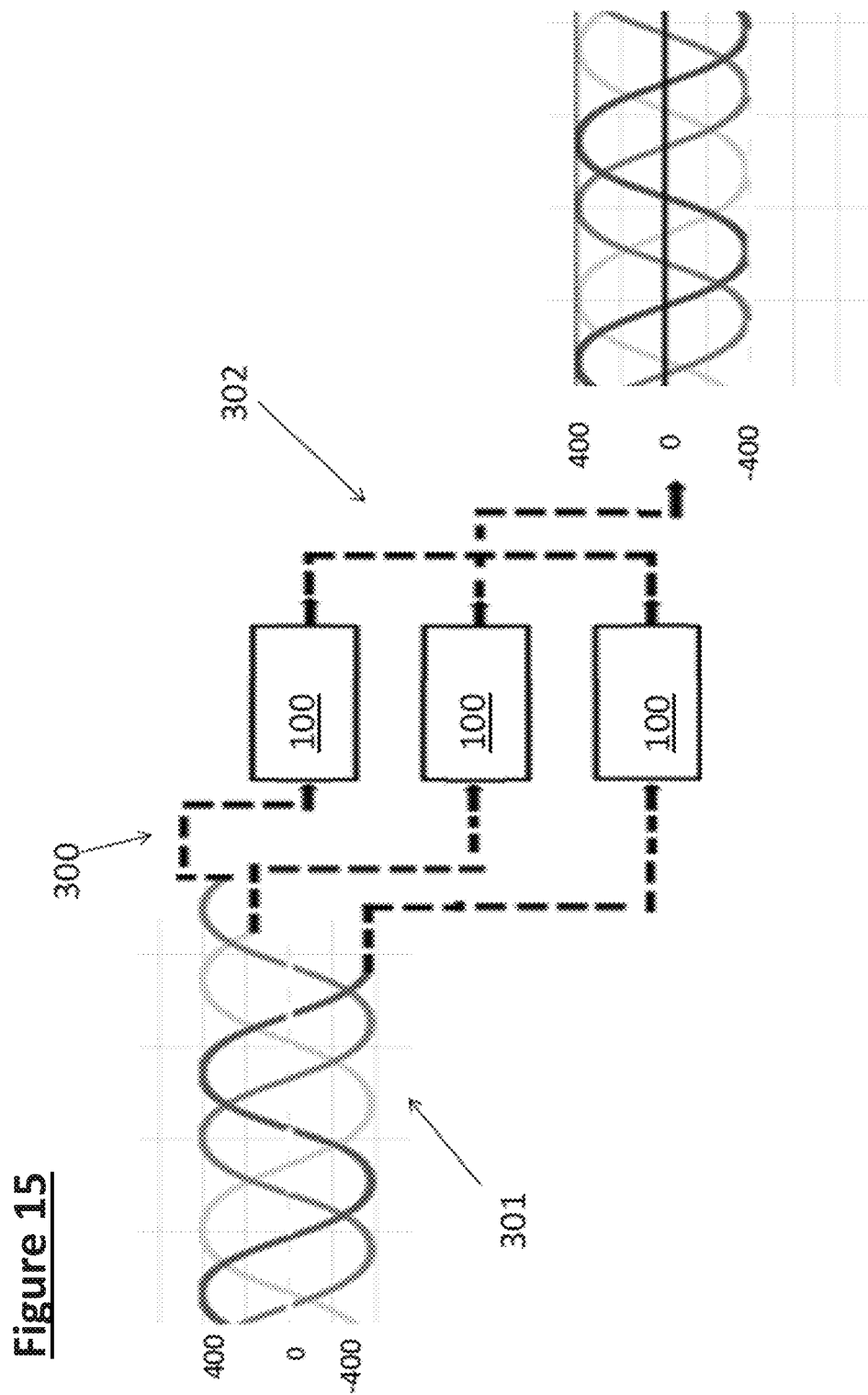
FIG. 15 shows a schematic example of a three phase input to a battery charger of some embodiments.

FIG. 14 illustrates a schematic example of a multi-cell battery control unit in use. In this example the battery comprises n cells arranged in parallel and/or series. The example functions in a similar way to the example described above in relation to FIG. 13, with the exception that the voltage across each cell $V_{cell(i)}$, the change in voltage across each cell $\Delta V_{cell(i)}$, and the temperature of each cell $T_{cell(i)}$ is measured. The current $I_{cell}$ will be the same through each cell. The measurements from all cells are passed to the secondary controller, along with the current $I_{cell}$ (and/or the change in current $\Delta I_{cell}$). The battery internal impedance of each cell $Z_{cell(i)}$ can be calculated by dividing the current (or change in current) by the change in voltage across that cell $\Delta V_{cell(i)}$.

The controller uses this information to choose from a Look Up Table the most appropriate battery charging mode, and changes the duty cycle of the primary controller, taking into account the situation of all the battery cells.

In some embodiments of the invention a rectified sinusoidal current is used to charge batteries, and the voltage ripple natural to this charging method is used (along with the current) to measure the internal impedance of the cell. This allows the internal impedance of the cell to be substantially continuously monitored, allowing a controller to continuously monitor the battery health through the internal impedance calculation and change charging modes on the fly.

In some embodiments, a primary controller is used to control the battery charging current. The Primary Controller consists of a Programmable Chip device. It senses:

the Grid Input Voltage through a High Voltage Divider the Flyback Primary Current through a Primary Current Shunt connected at the Primary MOSFET Source the Control Signal coming from the Primary Controller through the Isolating Optocoupler the Bias Voltage from the Flyback Transformer The circuit is arranged and functions as follows:

1. The Grid Input Voltage after the High Voltage Divider is amplified or attenuated by the Control Signal, through a Variable Gain Amplifier inside the programmable chip.

2. The output of this amplifier is fed to the noninverting input of a comparator inside the programmable chip.

3. The voltage from the Primary Current Shunt (connected at the Primary MOSFET Source) is connected to the inverting input of this comparator.

4. The output from this comparator is the Reset signal to a Set reset FlipFlop inside the programmable chip.

5. The output from the Bias Winding of the Flyback Transformer is connected to the inverting input of another comparator inside the programmable chip.

6. The noninverting input of this comparator is grounded

7. The output from this comparator is the Set Signal to the Flip Flop.

8. The output from the Flip Flop is connected to the Gate of the Primary Power MOSFET.

So: The Gate Signal to Primary Power MOSFET can:

Start when all the Energy Stored in the Flyback Transformer has been delivered to the Battery; and End when the voltage on the Primary Current Shunt (connected at the PrimaryMOSFET Source) has reached the value of the Input Voltage, divided (by the High Voltage Divider) and amplified or attenuated by the Control Signal (coming from the Primary Controller through the Isolating Optocoupler)

In this way the Grid Current can be in phase with the Grid Voltage (PFC Converter).

The Control Signal is made by the Primary Controller (which is also another programmable chip) according to the: Grid Input Voltage, Primary Peak Current, Battery Voltage, Battery Current, Battery Temperature In some embodiments, a multi-phase charger 300 may be provided by connecting a plurality of battery charging systems 100 in parallel between a multi-phase input 301 and an output 302. Therefore, in some such embodiments, the multi-phase charger 300 may include a plurality of battery charging systems 100 (e.g. as described herein). A battery charging system 100 may be provided for each phase of the multi-phase input 301. Accordingly, in a three phase system with a three phase multi-phase input 301 there may be three battery charging systems 100 provided in the multi-phase charger 300.

Each battery charging system 100 may be electrically connected between a single phase of the multi-phase input 301 and the output 302. In some embodiments, the output 302 is common to all of the battery charging systems 100 of the multi-phase input 301. Accordingly, the terminals 107 of each battery charging system 100 may be connected to provide the common output 302 (which may have common ground and a common live terminal). In some embodiments, therefore, the combined output from the battery charging systems 100 of the multi-phase charger 300 may provide the charging current, as described herein. The battery charging systems 100 of the multi-phase charger 300 may, therefore, be controlled according to achieve this effect. As such the control sub-systems 110 of each battery charging system 100 (if provided) may be communicatively coupled. In some embodiments, the multi-phase input 301 provides an input voltage of between about 200 and about 800 $V_{RMS}$. The output 301 may between about 100 and about 800 $V_{DC}$.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof

What is claimed is:

1. A multi-phase battery charger including a plurality of battery charging systems for providing a charging current to a battery, each battery charging system being adapted to provide a current with an oscillating waveform, wherein the oscillating waveform is partially in the form of a sine-squared wave, wherein each battery charging system is configured to receive an input from a single phase of a multi-phase input and to provide its current to a combined output, and wherein the combined output from the battery charging systems provides the charging current.

2. The battery charger according to claim 1, wherein a peak-to-peak variation in the currents with oscillating waveforms is greater than 1 amp.

3. The battery charger according to claim 1, wherein a peak-to-peak variation in the currents with oscillating waveforms is between 10 amps and 30 amps.

4. The battery charger according to claim 1, wherein a peak-to-peak variation in the currents with oscillating waveforms is at least 10 times a capacity of the battery with the currents measured in A and the battery capacity measured in Ah.

5. A method of charging a battery, the method comprising:
converting a plurality of alternating polarity outputs of a multiphase power source, each alternating polarity output being a single phase of the multiphase power source, to respective charging currents;
generating a combined output from the respective charging currents; and
providing the combined output to the battery, wherein each charging current has an oscillating waveform, and wherein each oscillating waveform is partially in the form of a sine-squared wave.

6. The method according to claim 5, wherein a peak-to-peak variation in the currents with oscillating waveforms is greater than 1 amp.

7. The method according to claim 5, wherein a peak-to-peak variation in the currents with oscillating waveforms is between 10 amps and 30 amps.

8. The method according to claim 5, wherein a peak-to-peak variation in the currents with oscillating waveforms is at least 10 times a capacity of the battery with the currents measured in A and the battery capacity measured in Ah.

* * * * *